(12) United States Patent
Ha et al.

(10) Patent No.: US 7,741,154 B2
(45) Date of Patent: Jun. 22, 2010

(54) INTEGRATED CIRCUIT PACKAGE SYSTEM WITH STACKING MODULE

(75) Inventors: Jong-Woo Ha, Seoul (KR); Flynn Carson, Redwood City, CA (US); BumJoon Hong, Seoul (KR); SeongMin Lee, Seoul (KR)

(73) Assignee: STATS Chippac Ltd., Singapore (SG)

( * ) Notice: Subject to any disclaimer, the term of this patent is extended or adjusted under 35 U.S.C. 154(b) by 303 days.

(21) Appl. No.: 12/055,962

(22) Filed: Mar. 26, 2008

(65) Prior Publication Data
US 2009/0243071 A1 Oct. 1, 2009

(51) Int. Cl.
H01L 21/00 (2006.01)
H01L 23/495 (2006.01)
H05K 5/02 (2006.01)

(52) U.S. Cl. .................. 438/109; 438/123; 438/124; 438/127; 257/672; 257/690; 257/784; 361/813

(58) Field of Classification Search .................. None
See application file for complete search history.

(56) References Cited

U.S. PATENT DOCUMENTS

| | | | |
|---|---|---|---|
| 7,354,800 B2 * | 4/2008 | Carson | 438/109 |
| 2006/0220256 A1 | 10/2006 | Shim et al. | |
| 2006/0244157 A1 * | 11/2006 | Carson | 257/787 |
| 2007/0108583 A1 | 5/2007 | Shim et al. | |
| 2007/0190690 A1 | 8/2007 | Chow et al. | |
| 2007/0210443 A1 | 9/2007 | Merilo et al. | |
| 2007/0235216 A1 * | 10/2007 | Bae et al. | 174/260 |
| 2007/0278696 A1 | 12/2007 | Lu et al. | |
| 2008/0029858 A1 | 2/2008 | Merilo et al. | |
| 2008/0157319 A1 * | 7/2008 | Ha et al. | 257/686 |
| 2008/0169549 A1 * | 7/2008 | Carson | 257/686 |

* cited by examiner

Primary Examiner—Alonzo Chambliss
(74) Attorney, Agent, or Firm—Mikio Ishimaru

(57) ABSTRACT

An integrated circuit package system comprising: providing a module lead array; attaching a module integrated circuit adjacent the module lead array; attaching a module substrate over the module integrated circuit; and applying a module encapsulant over the module integrated circuit wherein the module lead array and the module substrate are partially exposed.

20 Claims, 12 Drawing Sheets

INTEGRATED CIRCUIT PACKAGE SYSTEM WITH STACKING MODULE

TECHNICAL FIELD

The present invention relates generally to integrated circuits and more particularly to a system for integrated circuit packages with stacking module.

BACKGROUND ART

Many modern conveniences include electronic devices. So much so that our lives are filled with electronic devices though often, we take them for granted overlooking the electronic content. Every day tasks like banking, shopping, watching television, and even exercising often include electronic devices such as automated teller machines (ATM), cash registers, exercise equipment, and wristwatches.

The proliferation of electronic devices has brought with it demands for improved products. The demand has created a consistent if not increasing expectation for new features, higher speed, more data, smaller sizes for portability, etc. Development of electronic technology has been driven to reduce size, improve utility, and increase performance of the integrated circuit devices in an ever-increasing range of products.

Packages of components such as semiconductor circuits, transistors, diodes and other electronic devices must also become smaller and thinner with more functions and connections. In packaging components, the need for connecting leads largely influences package dimensions. Many attempts have been made to improve package density including thin packs, multi integrated circuit die modules, and stacking modules.

Stacking integrated circuit die or integrated circuit packages has been limited by connection types and quantities. Attempts to stack devices with large numbers of connections have been costly. Additional or expensive materials along with more processing both steps and complexity have been required to provide improved connectivity. Some attempts include multiple substrates often with multiple layers and more costly interconnect due in part to processing.

Thus, a need still remains for improving packaging density while maintaining compatibility, flexibility, reliability, yield, and manufacturing throughput to improve performance and control costs in systems for integrated circuit packages.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a module lead array; attaching a module integrated circuit adjacent the module lead array; attaching a module substrate over the module integrated circuit; and applying an encapsulant over the module integrated circuit wherein the module lead array and the module substrate are partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
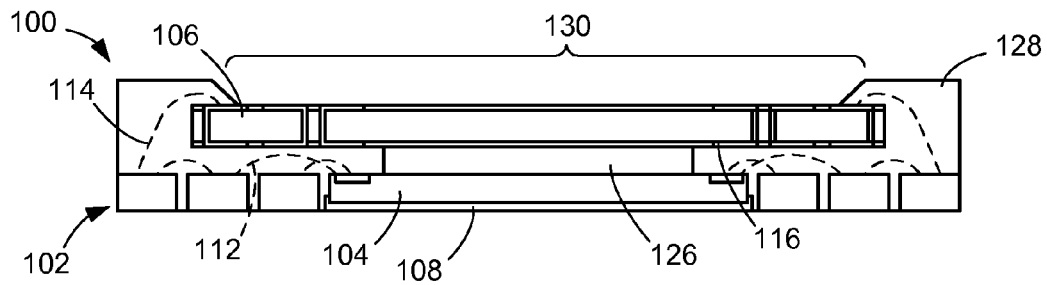
FIG. 1 is a cross-sectional view of an integrated circuit package system taken along lines 1-1 of FIG. 5 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 5:
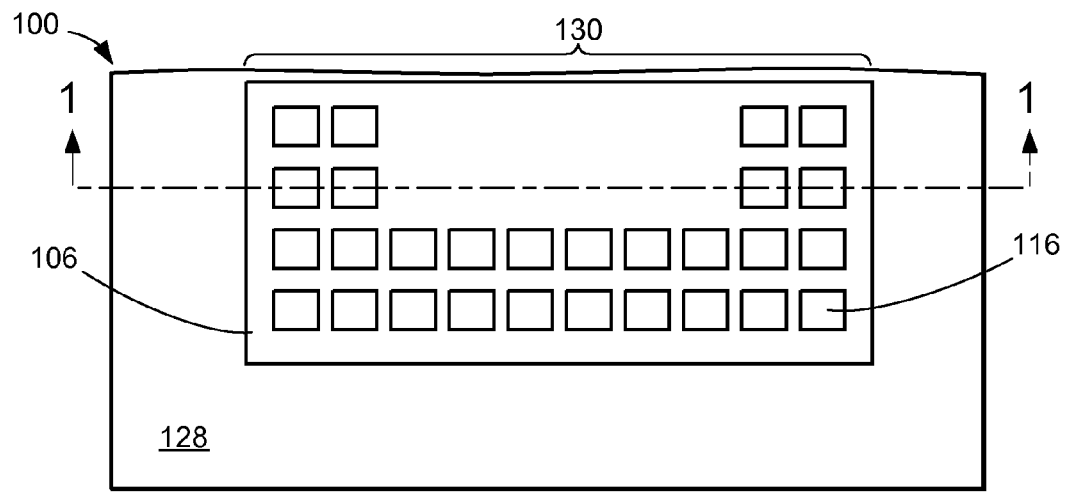
FIG. 5 is a top plan view of the integrated circuit package system.

Referring now to FIG. 1, therein is shown a cross-sectional view of an integrated circuit package system 100 taken along lines 1-1 of FIG. 5 in a first embodiment of the present invention. The integrated circuit package system 100 preferably includes a module lead array 102, a module integrated circuit 104 connected thereto, and a module substrate 106 over the module integrated circuit 104.

The module integrated circuit 104 can be attached or mounted with a module die attach layer 108 applied over a die attach region such as a tape, fixture, or pad (not shown). The module die attach layer 108 can provide a substantially fixed position for the module integrated circuit 104 particularly during further processing with the module integrated circuit 104 such connection thereto or mounting thereover.

Module die connectors 112 can electrically connect the module integrated circuit 104 or the module lead array 102. Similarly, module substrate connectors 114 can electrically connect the module substrate 106 to the module lead array 102. The module die connectors 112 and the module substrate connectors 114 can provide connectivity for the module integrated circuit 104 with the module lead array 102 or thereby the module substrate 106.

The module substrate 106 can include module substrate conductors 116. The module substrate conductors 116 can provide electrical connections through the module substrate 106 as well as over surfaces of the module substrate 106. The module substrate conductors 116 can provide electrical connectivity for other devices or components such as another package, electrical connectors, or a next level system.

A spacer 126 can be attached or mounted over the module integrated circuit 104 providing spacing to the module substrate 106. The spacing can be predetermined for providing standoff or insulation without damaging packaging components including the module die connectors 112. The spacer 126 can be formed of any material including organic material such as film adhesive.

A module encapsulant 128 can cover or protect the module integrated circuit 104, the module die connectors 112, and the module substrate connectors 114. The module encapsulant 128 can provide substantially fixed positions for the module die connectors 112 and the module substrate connectors 114 resulting in electrical isolation of individual signals or electrical levels transmitted by the module die connectors 112 or the module substrate connectors 114.

The module encapsulant 128 can include a module encapsulant cavity 130. The module encapsulant cavity 130 can be formed over the module substrate 106 providing a side opposite the module integrated circuit 104 partially exposed. A portion of the module substrate conductors 116 can be exposed in the module encapsulant cavity 130 for electrical connectivity to or through the module substrate 106.

It has been unexpectedly discovered that the module lead array 102 can provide improved numbers of connections at a significantly lower cost. The integrated circuit package system 100 having the module substrate 106 over the module integrated circuit 104 attached to the module lead array 102 improves packaging density while maintaining compatibility, flexibility, reliability, yield, and manufacturing throughput to improve performance and significantly reduce costs.

Figure 2:
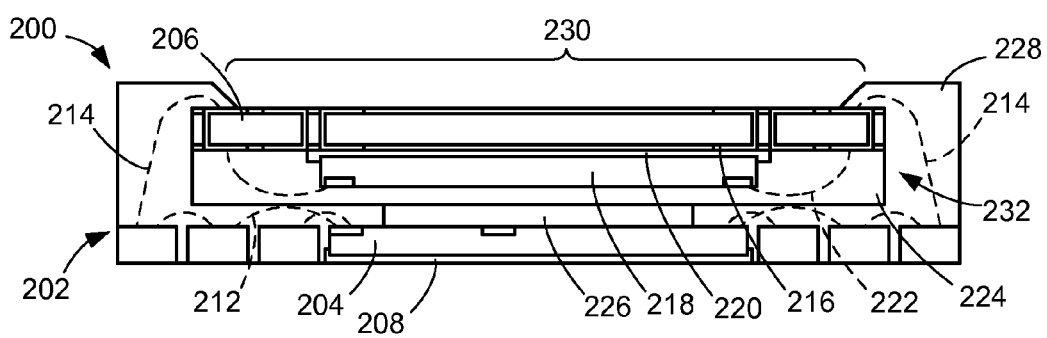
FIG. 2 is a cross-sectional view of an integrated circuit package system in a second embodiment of the present invention.

Referring now to FIG. 2 therein is shown a cross-sectional view of an integrated circuit package system 200 in a second embodiment of the present invention. The integrated circuit package system 200 preferably includes a module lead array 202, a module integrated circuit 204 connected thereto, and a module substrate 206 over the module integrated circuit 204.

The module integrated circuit 204 can be attached or mounted with a module die attach layer 208 applied over a die attach region such as a tape, fixture, or pad (not shown). The module die attach layer 208 can provide a substantially fixed position for the module integrated circuit 204 particularly during further processing with the module integrated circuit 204 such connection thereto or mounting thereover.

Module die connectors 212 can electrically connect the module integrated circuit 204 or the module lead array 202. Similarly, module substrate connectors 214 can electrically connect the module substrate 206 to the module lead array 202. The module die connectors 212 and the module substrate connectors 214 can provide connectivity for the module integrated circuit 204 with the module lead array 202 or thereby the module substrate 206.

The module substrate 206 can include module substrate conductors 216. The module substrate conductors 216 can provide electrical connections through the module substrate 206 as well as over surfaces of the module substrate 206. The module substrate conductors 216 can provide electrical connectivity for other devices or components such as another package, electrical connectors, or a next level system.

A module stack die 218 can be attached or mounted over the module substrate 206 with a stack attach layer 220 similar to the module die attach layer 208. Module stack connectors 222 can electrically connect the module stack die 218 and the module substrate 206 providing connectivity for the module stack die 218 to the module integrated circuit 204, devices, or components. A module stack encapsulant 224 can cover and protect the module stack die 218 and the module stack connectors 222.

A spacer 226 can be attached or mounted over the module integrated circuit 204 providing spacing to the module substrate 206. The spacing can be predetermined for providing standoff or insulation without damaging packaging components including the module die connectors 212. The spacer 226 can be formed of any material including organic material such as film adhesive.

A module encapsulant 228 can cover or protect the module integrated circuit 204, the module die connectors 212, and the module substrate connectors 214. The module encapsulant 228 can provide substantially fixed positions for the module die connectors 212 and the module substrate connectors 214 resulting in electrical isolation of individual signals or electrical levels transmitted by the module die connectors 212 or the module substrate connectors 214.

The module encapsulant 228 can include a module encapsulant cavity 230. The module encapsulant cavity 230 can be formed over the module substrate 206 providing a side opposite the module integrated circuit 204 partially exposed. A portion of the module substrate conductors 216 can be exposed in the module encapsulant cavity 230 for electrical connectivity to or through the module substrate 206.

For illustrative purposes, a module stack component 232 is shown having the module stack die 218, the module substrate 206, the stack attach layer 220, the module stack connectors 222, and the module stack encapsulant 224 although it is understood that the module stack component 232 may be any component or combination of components.

Figure 3:
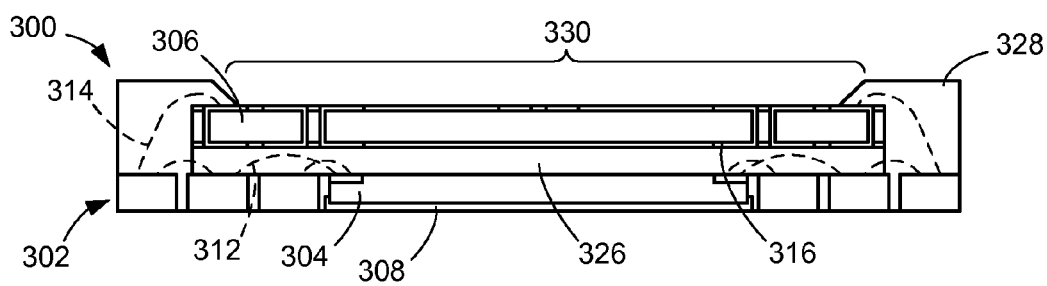
FIG. 3 is a cross-sectional view of an integrated circuit package system in a third embodiment of the present invention.

Referring now to FIG. 3, therein is shown a cross-sectional view of an integrated circuit package system 300 in a third embodiment of the present invention. The integrated circuit package system 300 preferably includes a module lead array 302, a module integrated circuit 304 connected thereto, and a module substrate 306 over the module integrated circuit 304.

The module integrated circuit 304 can be attached or mounted with a module die attach layer 308 applied over a die attach region such as a tape, fixture, or pad (not shown). The module die attach layer 308 can provide a substantially fixed position for the module integrated circuit 304 particularly during further processing with the module integrated circuit 304 such connection thereto or mounting thereover.

Module die connectors 312 can electrically connect the module integrated circuit 304 or the module lead array 302. Similarly, module substrate connectors 314 can electrically connect the module substrate 306 to the module lead array 302. The module die connectors 312 and the module substrate connectors 314 can provide connectivity for the module integrated circuit 304 with the module lead array 302 or thereby the module substrate 306.

The module substrate 306 can include module substrate conductors 316. The module substrate conductors 316 can provide electrical connections through the module substrate 306 as well as over surfaces of the module substrate 306. The module substrate conductors 316 can provide electrical connectivity for other devices or components such as another package, electrical connectors, or a next level system.

A spacer 326 can be formed over the module integrated circuit 304 providing spacing to the module substrate 306. The spacing can be predetermined for providing standoff or insulation without damaging packaging components including the module die connectors 312. The spacer 326 can encapsulate a portion of the module die connectors 312 and include any material including a film for wire-in-film technology.

A module encapsulant 328 can cover or protect the module integrated circuit 304, the module die connectors 312, and the module substrate connectors 314. The module encapsulant 328 can provide substantially fixed positions for the module die connectors 312 and the module substrate connectors 314 resulting in electrical isolation of individual signals or electrical levels transmitted by the module die connectors 312 or the module substrate connectors 314.

The module encapsulant 328 can include a module encapsulant cavity 330. The module encapsulant cavity 330 can be formed over the module substrate 306 providing a side opposite the module integrated circuit 304 partially exposed. A portion of the module substrate conductors 316 can be exposed in the module encapsulant cavity 330 for electrical connectivity to or through the module substrate 306.

Figure 4:
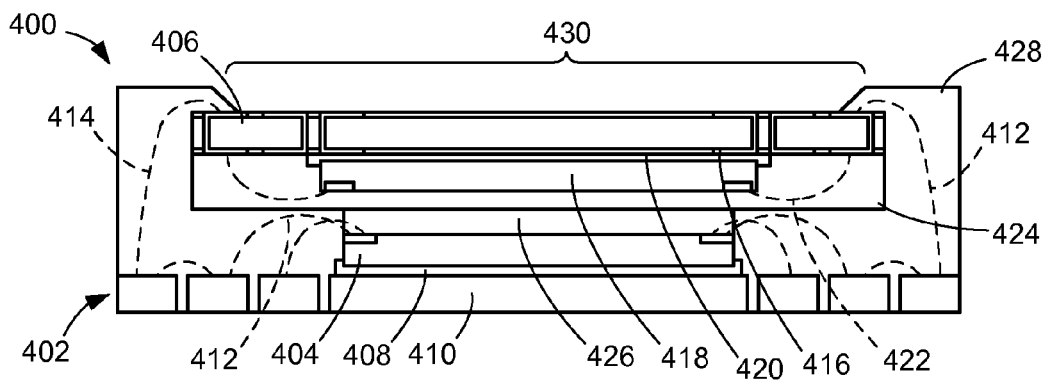
FIG. 4 is a cross-sectional view of an integrated circuit package system in a fourth embodiment of the present invention.

Referring now to FIG. 4, therein is shown a cross-sectional view of an integrated circuit package system 400 in a fourth embodiment of the present invention. The integrated circuit package system 400 preferably includes a module lead array 402, a module integrated circuit 404 connected thereto, and a module substrate 406 over the module integrated circuit 404.

The module integrated circuit 404 can be attached or mounted with a module die attach layer 408 applied over the module lead array 402 having a die attach region 410 such a die attach pad. The module die attach layer 408 and the die attach region 410 can provide a substantially fixed position for the module integrated circuit 404 particularly during further processing with the module integrated circuit 404 such connection thereto or mounting thereover.

Module die connectors 412 can electrically connect the module integrated circuit 404 or the module lead array 402. Similarly, module substrate connectors 414 can electrically connect the module substrate 406 to the module lead array 402. The module die connectors 412 and the module substrate connectors 414 can provide connectivity for the module integrated circuit 404 with the module lead array 402 or thereby the module substrate 406.

The module substrate 406 can include module substrate conductors 416. The module substrate conductors 416 can provide electrical connections through the module substrate 406 as well as over surfaces of the module substrate 406. The module substrate conductors 416 can provide electrical connectivity for other devices or components such as another package, electrical connectors, or a next level system.

A module stack die 418 can be attached or mounted over the module substrate 406 with a stack attach layer 420 similar to the module die attach layer 408. Module stack connectors 422 can electrically connect the module stack die 418 and the module substrate 406 providing connectivity for the module stack die 418 to the module integrated circuit 404, devices, or components. A module stack encapsulant 424 can cover and protect the module stack die 418 and the module stack connectors 422.

A spacer 426 can be formed over the module integrated circuit 404 providing spacing to the module substrate 406. The spacing can be predetermined for providing standoff or insulation without damaging packaging components including the module die connectors 412. The spacer 426 can encapsulate a portion of the module die connectors 412 and include any material including a film for wire-in-film technology.

A module encapsulant 428 can cover or protect the module integrated circuit 404, the module die connectors 412, and the module substrate connectors 414. The module encapsulant 428 can provide substantially fixed positions for the module die connectors 412 and the module substrate connectors 414 resulting in electrical isolation of individual signals or electrical levels transmitted by the module die connectors 412 or the module substrate connectors 414.

The module encapsulant 428 can include a module encapsulant cavity 430. The module encapsulant cavity 430 can be formed over the module substrate 406 providing a side opposite the module integrated circuit 404 partially exposed. A portion of the module substrate conductors 416 can be exposed in the module encapsulant cavity 430 for electrical connectivity to or through the module substrate 406.

Referring now to FIG. 5, therein is shown a top plan view of the integrated circuit package system 100. An edge portion of the integrated circuit package system 100 is shown for clarity. The integrated circuit package system 100 preferably includes the module encapsulant 128 and the module substrate 106 including the module substrate conductors 116. The module encapsulant 128 can be applied over a portion of the module substrate 106 forming the module encapsulant cavity 130.

The module encapsulant cavity 130 substantially exposes the module substrate 106 on a side opposite the module integrated circuit 104 of FIG. 1. A portion of the module substrate conductors 116 can be substantially exposed through the module encapsulant cavity 130. The module substrate conductors 116 can provide electrical connectivity to other devices or components such as other packages, electrical connectors, or a next level system.

Figure 6:
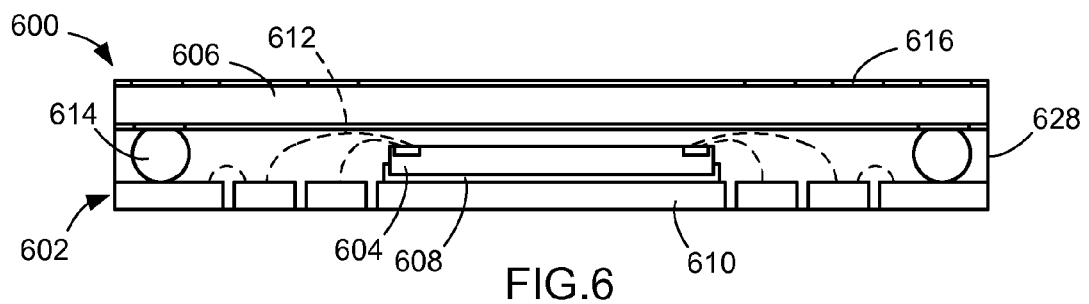
FIG. 6 is a cross-sectional view of an integrated circuit package system taken along lines 6-6 of FIG. 10 in a fifth embodiment of the present invention.
Figure 10:
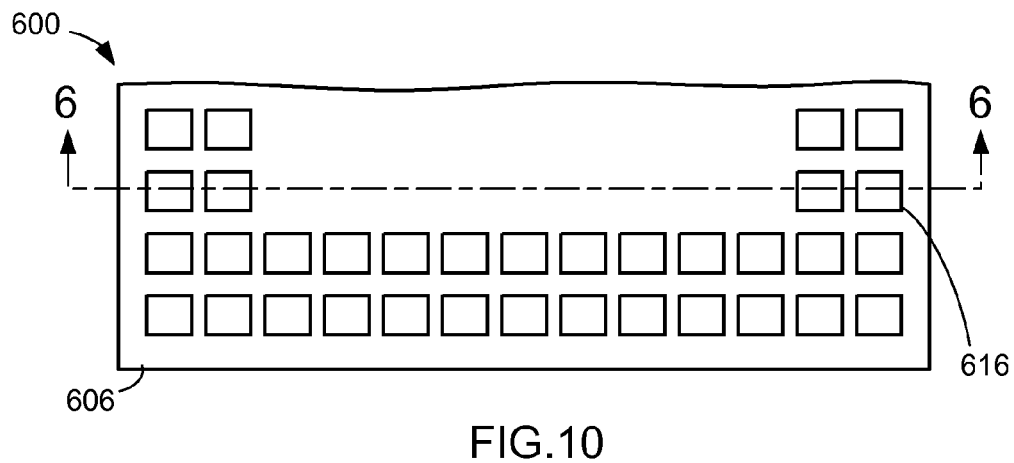
FIG. 10 is a top plan view of the integrated circuit package system.

Referring now to FIG. 6, therein is shown a cross-sectional view of an integrated circuit package system 600 taken along lines 6-6 of FIG. 10 in a fifth embodiment of the present invention. The integrated circuit package system 600 preferably includes a module lead array 602, a module integrated circuit 604 connected thereto, and a module substrate 606 over the module integrated circuit 604.

The module integrated circuit 604 can be attached or mounted with a module die attach layer 608 applied over the module lead array 602 having a die attach region 610 such a die attach pad. The module die attach layer 608 and the die attach region 610 can provide a substantially fixed position for the module integrated circuit 604 particularly during further processing with the module integrated circuit 604 such connection thereto or mounting thereover.

Module die connectors 612 can electrically connect the module integrated circuit 604 or the module lead array 602. Embedded connectors 614 can electrically connect the module substrate 606 to the module lead array 602. The module die connectors 612 and the embedded connectors 614 can provide connectivity for the module integrated circuit 604 with the module lead array 602 or thereby the module substrate 606.

For illustrative purposes, the embedded connectors 614 are shown as solder balls although it is understood that the embedded connectors 614 may be of any shape or material. For example, the embedded connectors 614 can be formed in shapes such as spheres, pillars, studs, or combinations thereof as well as include materials such as tin (Sn), lead (Pb), gold (Au), copper (Cu), or combination thereof.

The module substrate 606 can include module substrate conductors 616. The module substrate conductors 616 can provide electrical connections through the module substrate 606 as well as over surfaces of the module substrate 606. The module substrate conductors 616 can provide electrical connectivity to the embedded connectors 614 or for other devices or components such as another package, electrical connectors, or a next level system.

A module encapsulant 628 can cover or protect the module integrated circuit 604, the module die connectors 612, and the embedded connectors 614. The module encapsulant 628 can provide substantially fixed positions for the module die connectors 612 and the embedded connectors 614 for electrical isolation. The embedded connectors 614 can also be partially exposed providing a mounting or connection region for the module substrate 606.

Figure 7:
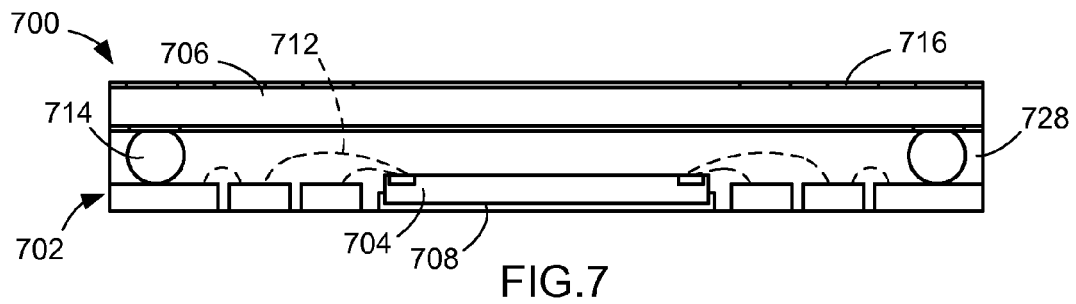
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes a module lead array 702, a module integrated circuit 704 connected thereto, and a module substrate 706 over the module integrated circuit 704.

The module integrated circuit 704 can be attached or mounted with a module die attach layer 708 applied over a die attach region such as a tape, fixture, or pad (not shown). The module die attach layer 708 can provide a substantially fixed position for the module integrated circuit 704 particularly during further processing with the module integrated circuit 704 such connection thereto or mounting thereover.

Module die connectors 712 can electrically connect the module integrated circuit 704 or the module lead array 702. Embedded connectors 714 can electrically connect the module substrate 706 to the module lead array 702. The module die connectors 712 and the embedded connectors 714 can provide connectivity for the module integrated circuit 704 with the module lead array 702 or thereby the module substrate 706.

For illustrative purposes, the embedded connectors 714 are shown as solder balls although it is understood that the embedded connectors 714 may be of any shape or material. For example, the embedded connectors 714 can be formed in shapes such as spheres, pillars, studs, or combinations thereof as well as include materials such as tin, lead, gold, copper, or combination thereof.

The module substrate 706 can include module substrate conductors 716. The module substrate conductors 716 can provide electrical connections through the module substrate 706 as well as over surfaces of the module substrate 706. The module substrate conductors 716 can provide electrical connectivity to the embedded connectors 714 or for other devices or components such as another package, electrical connectors, or a next level system.

A module encapsulant 728 can cover or protect the module integrated circuit 704, the module die connectors 712, and the embedded connectors 714. The module encapsulant 728 can provide substantially fixed positions for the module die connectors 712 and the embedded connectors 714 for electrical isolation. The embedded connectors 714 can also be partially exposed providing a mounting or connection region for the module substrate 706.

Figure 8:
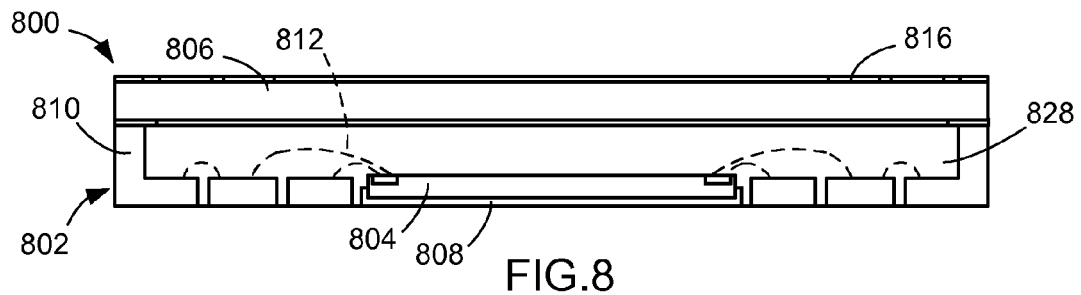
FIG. 8 is a cross-sectional view of an integrated circuit package system in a seventh embodiment of the present invention.

Referring now to FIG. 8, therein is shown a cross-sectional view of an integrated circuit package system 800 in a seventh embodiment of the present invention. The integrated circuit package system 800 preferably includes a module lead array 802, a module integrated circuit 804 connected thereto, and a module substrate 806 over the module integrated circuit 804.

The module integrated circuit 804 can be attached or mounted with a module die attach layer 808 applied over a die attach region such as a tape, fixture, or pad (not shown). The module die attach layer 808 can provide a substantially fixed position for the module integrated circuit 804 particularly during further processing with the module integrated circuit 804 such connection thereto or mounting thereover.

The module lead array 802 can also include post type leads 810 connecting the module substrate 806 to the module lead array 802. Module die connectors 812 can electrically connect the module integrated circuit 804 or the module lead array 802 including the post type leads 810. The module die connectors 812 and the post type leads 810 can provide connectivity for the module integrated circuit 804 with the module lead array 802 or the module substrate 806.

For illustrative purposes, the post type leads 810 are shown having vertical extensions from the module lead array 802 although it is understood that the post type leads 810 may be of any shape or material. For example, the post type leads 810 can be formed near a perimeter of the module lead array 802 and protrude substantially perpendicular to the module lead array 802.

The module substrate 806 can include module substrate conductors 816. The module substrate conductors 816 can provide electrical connections through the module substrate 806 as well as over surfaces of the module substrate 806. The module substrate conductors 816 can provide electrical connectivity to the post type leads 810 or for other devices or components such as another package, electrical connectors, or a next level system.

A module encapsulant 828 can cover or protect the module integrated circuit 804, the module die connectors 812, and the post type leads 810. The module encapsulant 828 can provide substantially fixed positions for the module die connectors 812 and the post type leads 810 for electrical isolation. The post type leads 810 can also be partially exposed providing a mounting or connection region for the module substrate 806.

Figure 9:
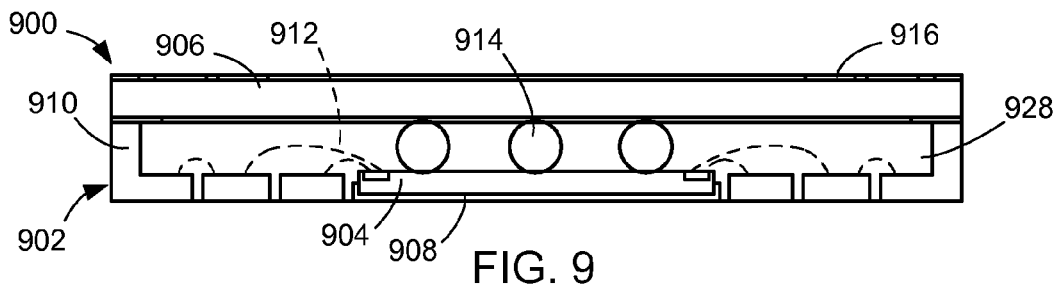
FIG. 9 is a cross-sectional view of an integrated circuit package system in an eighth embodiment of the present invention.

Referring now to FIG. 9, therein is shown a cross-sectional view of an integrated circuit package system 900 in an eighth embodiment of the present invention. The integrated circuit package system 900 preferably includes a module lead array 902, a module integrated circuit 904 connected thereto, and a module substrate 906 over the module integrated circuit 904.

The module integrated circuit 904 can be attached or mounted with a module die attach layer 908 applied over a die attach region such as a tape, fixture, or pad (not shown). The module die attach layer 908 can provide a substantially fixed position for the module integrated circuit 904 particularly during further processing with the module integrated circuit 904 such connection thereto or mounting thereover.

The module lead array 902 can also include post type leads 910 connecting the module substrate 906 to the module lead array 902. Module die connectors 912 can electrically connect the module integrated circuit 904 or the module lead array 902 including the post type leads 910. The module die connectors 912 and the post type leads 910 can provide connectivity for the module integrated circuit 904 with the module lead array 902 or the module substrate 906.

For illustrative purposes, the post type leads 910 are shown having vertical extensions from the module lead array 902 although it is understood that the post type leads 910 may be of any shape or material. For example, the post type leads 910 can be formed near a perimeter of the module lead array 902 and protrude substantially perpendicular to the module lead array 902.

Optionally, embedded connectors 914 can also provide connectivity for the module substrate 906. For example, the embedded connectors 914 can be formed over the module integrated circuit 904 and having a mounting height substantially the same as the post type leads 910 providing a substantially planar surface for connecting or mounting the module substrate 906.

The module substrate 906 can include module substrate conductors 916. The module substrate conductors 916 can provide electrical connections through the module substrate 906 as well as over surfaces of the module substrate 906. The module substrate conductors 916 can provide electrical connectivity to the post type leads 910 or for other devices or components such as another package, electrical connectors, or a next level system.

A module encapsulant 928 can cover or protect the module integrated circuit 904, the module die connectors 912, the post type leads 910, or the embedded connectors 914. The module encapsulant 928 can provide substantially fixed positions for the module die connectors 912, the post type leads 910, or the embedded connectors 914 for electrical isolation. The post type leads 910 or the embedded connectors 914 can also be partially exposed providing a mounting or connection region for the module substrate 906.

Referring now to FIG. 10, therein is shown a top plan view of the integrated circuit package system 600. An edge portion of the integrated circuit package system 600 is shown for clarity. The integrated circuit package system 600 preferably includes the module substrate 606 including the module substrate conductors 616.

The module substrate conductors 616 of the module substrate 606 are substantially exposed on a side opposite the module integrated circuit 604 of FIG. 6. The module substrate conductors 616 can provide electrical connectivity to other devices or components such as other packages, electrical connectors, or a next level system.

Figure 11:
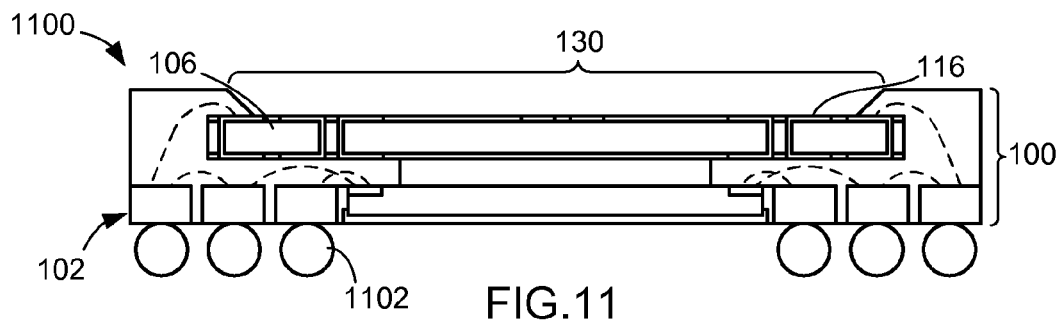
FIG. 11 is a cross-sectional view of an integrated circuit package system in a ninth embodiment of the present invention.

Referring now to FIG. 11, therein is shown a cross-sectional view of an integrated circuit package system 1100 in a ninth embodiment of the present invention. The integrated circuit package system 1100 preferably includes the integrated circuit package system 100 and module connectors 1102 such as solder or other conductive material.

The module connectors 1102 attached over the module lead array 102 can be substantially exposed for electrical connectivity for other devices or components such as another package, electrical connectors, or a next level system.

Similarly, the module substrate conductors 116 of the module substrate 106 can be substantially exposed through the module encapsulant cavity 130 for electrical connectivity for other devices or components such as another package, electrical connectors, or a next level system.

Figure 12:
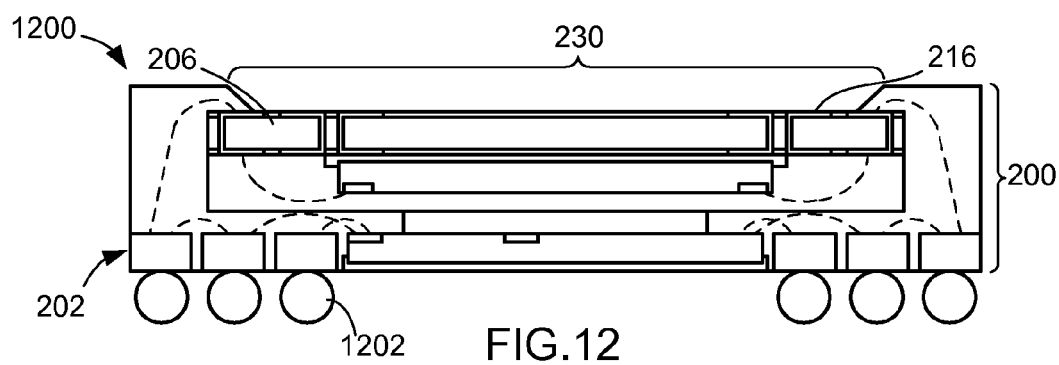
FIG. 12 is a cross-sectional view of an integrated circuit package system in a tenth embodiment of the present invention.

Referring now to FIG. 12, therein is shown a cross-sectional view of an integrated circuit package system 1200 in a tenth embodiment of the present invention. The integrated circuit package system 1200 preferably includes the integrated circuit package system 200 and module connectors 1202 such as solder or other conductive material.

The module connectors 1202 attached over the module lead array 202 can be substantially exposed for electrical connectivity for other devices or components such as another package, electrical connectors, or a next level system.

Similarly, the module substrate conductors 216 of the module substrate 206 can be substantially exposed through the module encapsulant cavity 230 for electrical connectivity for other devices or components such as another package, electrical connectors, or a next level system.

Figure 13:
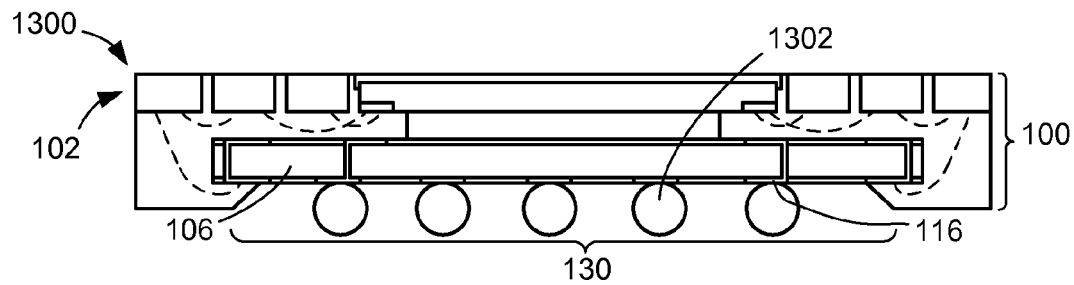
FIG. 13 is a cross-sectional view of an integrated circuit package system in an eleventh embodiment of the present invention.

Referring now to FIG. 13, therein is shown a cross-sectional view of an integrated circuit package system 1300 in an eleventh embodiment of the present invention. The integrated circuit package system 1300 preferably includes the integrated circuit package system 100 and module connectors 1302 such as solder or other conductive material.

The integrated circuit package system 100 is shown in an inverted configuration for attaching or mounting the module substrate 106 over another component as well as providing an attaching or mounting surface over the module lead array 102.

The module connectors 1302 attached through the module encapsulant cavity 130 and over the module substrate conductors 116 of the module substrate 106 can be substantially exposed for electrical connectivity for other devices or components such as another package, electrical connectors, or a next level system.

Similarly, an external surface of the module lead array 102 can be substantially exposed for electrical connectivity for other devices or components such as another package, electrical connectors, or a next level system.

Figure 14:
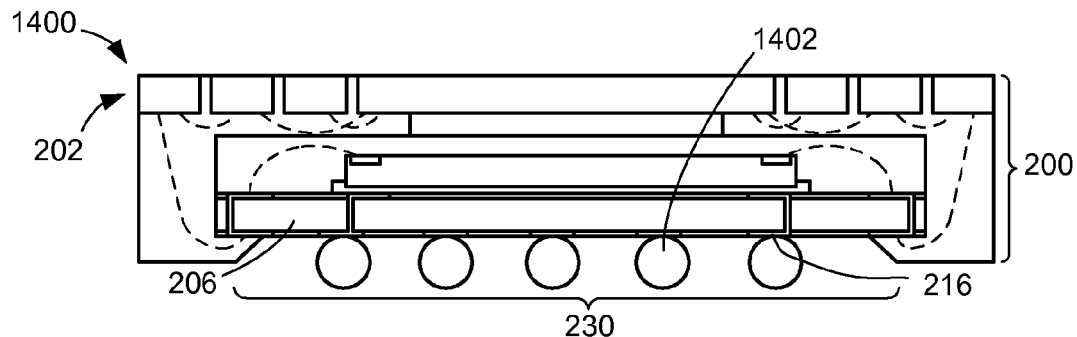
FIG. 14 is a cross-sectional view of an integrated circuit package system in a twelfth embodiment of the present invention.

Referring now to FIG. 14, therein is shown a cross-sectional view of an integrated circuit package system 1400 in a twelfth embodiment of the present invention. The integrated circuit package system 1400 preferably includes the integrated circuit package system 200 and module connectors 1402 such as solder or other conductive material.

The integrated circuit package system 200 is shown in an inverted configuration for attaching or mounting the module substrate 206 over another component as well as providing an attaching or mounting surface over the module lead array 202.

The module connectors 1402 attached through the module encapsulant cavity 230 and over the module substrate conductors 216 of the module substrate 206 can be substantially exposed for electrical connectivity for other devices or components such as another package, electrical connectors, or a next level system.

Similarly, an external surface of the module lead array 202 can be substantially exposed for electrical connectivity for other devices or components such as another package, electrical connectors, or a next level system.

Figure 15:
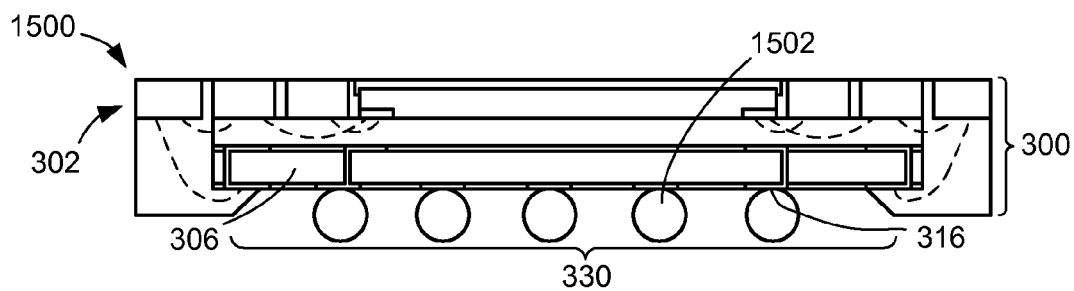
FIG. 15 is a cross-sectional view of an integrated circuit package system in a thirteenth embodiment of the present invention.

Referring now to FIG. 15, therein is shown a cross-sectional view of an integrated circuit package system 1500 in a thirteenth embodiment of the present invention. The integrated circuit package system 1500 preferably includes the integrated circuit package system 300 and module connectors 1502 such as solder or other conductive material.

The integrated circuit package system 300 is shown in an inverted configuration for attaching or mounting the module substrate 306 over another component as well as providing an attaching or mounting surface over the module lead array 302.

The module connectors 1502 attached through the module encapsulant cavity 330 and over the module substrate conductors 316 of the module substrate 306 can be substantially exposed for electrical connectivity for other devices or components such as another package, electrical connectors, or a next level system.

Similarly, an external surface of the module lead array 302 can be substantially exposed for electrical connectivity for other devices or components such as another package, electrical connectors, or a next level system.

Figure 16:
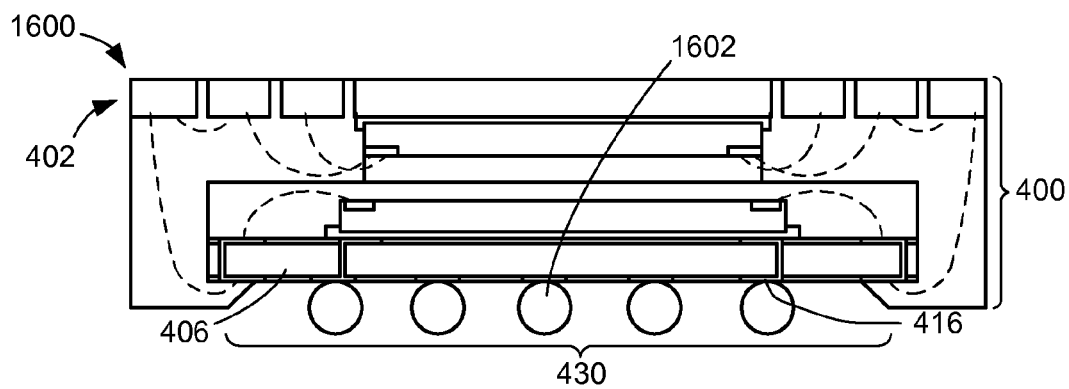
FIG. 16 is a cross-sectional view of an integrated circuit package system in a fourteenth embodiment of the present invention.

Referring now to FIG. 16, therein is shown a cross-sectional view of an integrated circuit package system 1600 in a fourteenth embodiment of the present invention. The integrated circuit package system 1600 preferably includes the integrated circuit package system 400 and module connectors 1602 such as solder or other conductive material.

The integrated circuit package system 400 is shown in an inverted configuration for attaching or mounting the module substrate 406 over another component as well as providing an attaching or mounting surface over the module lead array 402.

The module connectors 1602 attached through the module encapsulant cavity 430 and over the module substrate conductors 416 of the module substrate 406 can be substantially exposed for electrical connectivity for other devices or components such as another package, electrical connectors, or a next level system.

Similarly, an external surface of the module lead array 402 can be substantially exposed for electrical connectivity for other devices or components such as another package, electrical connectors, or a next level system.

Figure 17:
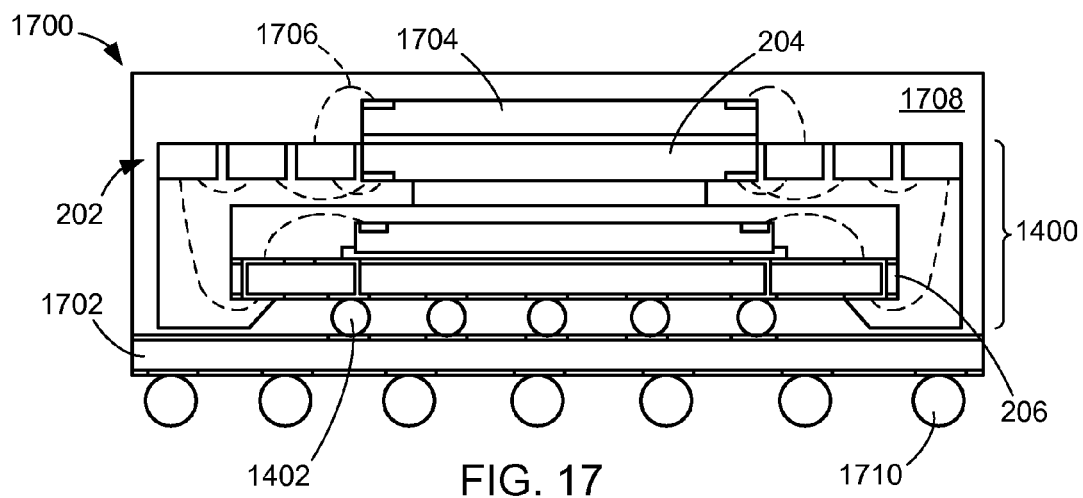
FIG. 17 is a cross-sectional view of an integrated circuit package system in a fifteenth embodiment of the present invention.

Referring now to FIG. 17, therein is shown a cross-sectional view of an integrated circuit package system 1700 in a fifteenth embodiment of the present invention. The integrated circuit package system 1700 preferably includes the integrated circuit package system 1400, a package substrate 1702, and a stack component 1704.

The integrated circuit package system 1400 can be attached or mounted over the package substrate 1702. The module connectors 1402 can electrically connect the module substrate 206 and the package substrate 1702 thereby providing connectivity for the integrated circuit package system 1400 to other devices, other components, or a next level system.

The stack component 1704 such as an integrated circuit die, an electronic component, or another package can be mounted over the module integrated circuit 204. Stack component connectors 1706 can electrically connect the stack component 1704 and the module lead array 202.

A package encapsulant 1708 can cover or protect the stack component 1704, the stack component connectors 1706, the integrated circuit package system 1400, and a portion of the package substrate 1702. The package encapsulant 1708 can be conformal providing sealing or structural integrity to components and devices.

Package connectors 1710 such as solder or other conductive material can be attached or formed over the package substrate 1702 on a side opposite the module connectors 1402. The package connectors 1710 can provide electrical connectivity to a next level system such as a printed circuit board or a product subsystem.

Figure 18:
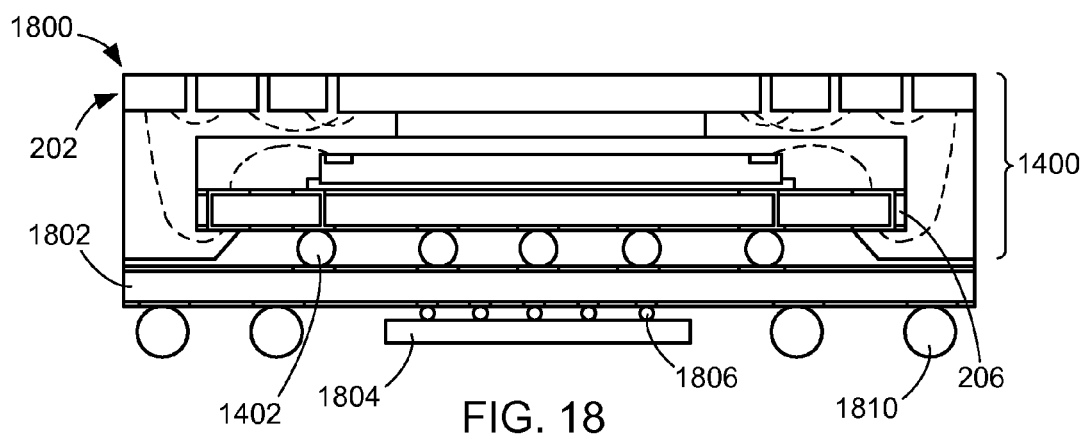
FIG. 18 is a cross-sectional view of an integrated circuit package system in a sixteenth embodiment of the present invention.

Referring now to FIG. 18, therein is shown a cross-sectional view of an integrated circuit package system 1800 in a sixteenth embodiment of the present invention. The integrated circuit package system 1800 preferably includes the integrated circuit package system 1400, a package substrate 1802, and a stack component 1804.

The integrated circuit package system 1400 can be attached or mounted over the package substrate 1802. The module connectors 1402 can electrically connect the module substrate 206 and the package substrate 1802 thereby providing connectivity for the integrated circuit package system 1400 to other devices, other components, or a next level system.

The stack component 1804 such as a flip chip die, an electronic device, or a chip scale package can be mounted over the module substrate 206. Stack component connectors 1806 can electrically connect the stack component 1804 and the module substrate 206.

Package connectors 1810 such as solder or other conductive material can be attached or formed over the package substrate 1802 on a side opposite the module connectors 1402. The package connectors 1810 can provide electrical connectivity to a next level system such as a printed circuit board or a product subsystem.

Figure 19:
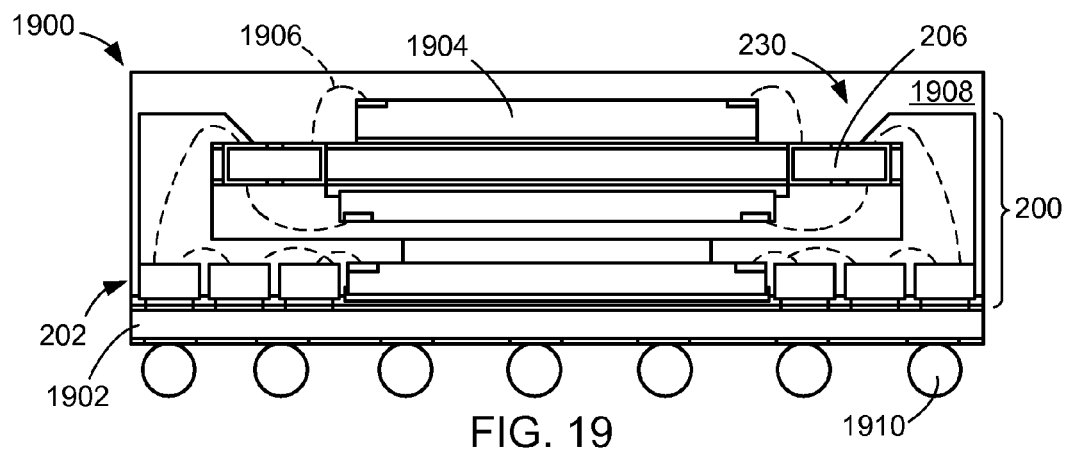
FIG. 19 is a cross-sectional view of an integrated circuit package system in a seventeenth embodiment of the present invention.

Referring now to FIG. 19, therein is shown a cross-sectional view of an integrated circuit package system 1900 in a seventeenth embodiment of the present invention. The integrated circuit package system 1900 preferably includes the integrated circuit package system 200, a package substrate 1902, and a stack component 1904.

The integrated circuit package system 200 can be attached or mounted over the package substrate 1902. The module lead array 202 can electrically connect to the package substrate 1902 thereby providing connectivity for the integrated circuit package system 200 to other devices, other components, or a next level system.

The stack component 1904 such as an integrated circuit die, an electronic component, or another package can be mounted over the module substrate 206 and at least partially in the module encapsulant cavity 230. Stack component connectors 1906 can electrically connect the stack component 1904 and the module substrate conductors 216.

A package encapsulant 1908 can cover or protect the stack component 1904, the stack component connectors 1906, the integrated circuit package system 200, and a portion of the package substrate 1902. The package encapsulant 1908 can be conformal providing sealing or structural integrity to components and devices.

Package connectors 1910 such as solder or other conductive material can be attached or formed over the package substrate 1902 on a side opposite the integrated circuit package system 200. The package connectors 1910 can provide electrical connectivity to a next level system such as a printed circuit board or a product subsystem.

Figure 20:
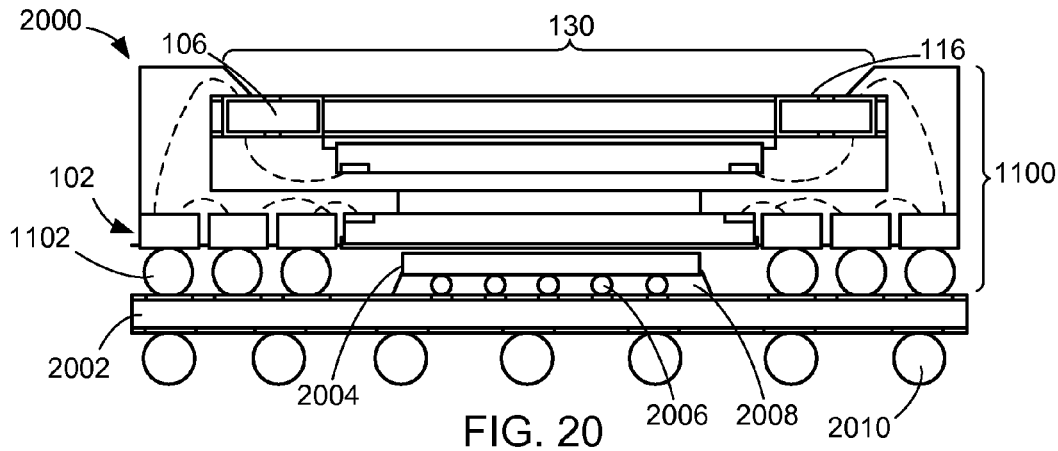
FIG. 20 is a cross-sectional view of an integrated circuit package system in an eighteenth embodiment of the present invention.

Referring now to FIG. 20, therein is shown a cross-sectional view of an integrated circuit package system 2000 in an eighteenth embodiment of the present invention. The integrated circuit package system 2000 preferably includes the integrated circuit package system 1100, a package substrate 2002, and a stack component 2004.

The integrated circuit package system 1100 can be attached or mounted over the package substrate 2002. The module lead array 102 can electrically connect to the package substrate 2002 thereby providing connectivity for the integrated circuit package system 1100 to other devices, other components, or a next level system.

The stack component 2004 such as an integrated circuit die, an electronic component, or another package can be mounted over the package substrate 2002. Stack component connectors 2006 can electrically connect the stack component 2004 and the package substrate 2002.

A fill material 2008 can be formed adjacent a side of the stack component 2004 having the stack component connectors 2006. The fill material 2008 can conform to the stack component connectors 2006, a side of the stack component 2004, or the package substrate 2002 and include any non-conductive material having adhesive or non-adhesive properties.

Package connectors 2010 such as solder or other conductive material can be attached or formed over the package substrate 2002 on as side opposite the stack component 2004. The package connectors 2010 can provide electrical connectivity to a next level system such as a printed circuit board or a product subsystem.

The module substrate 106 can include the module substrate conductors 116 partially exposed through the module encapsulant cavity 130. The module substrate 106 having the module substrate conductors 116 can provide a mounting region for other devices or other components.

Figure 21:
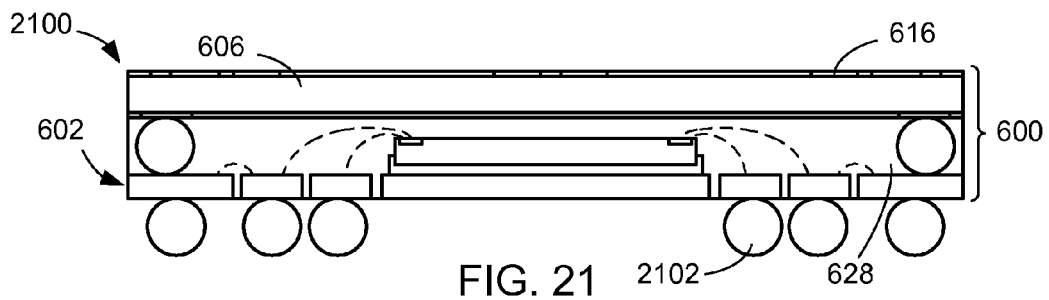
FIG. 21 is a cross-sectional view of an integrated circuit package system in a nineteenth embodiment of the present invention.

Referring now to FIG. 21, therein is shown a cross-sectional view of an integrated circuit package system 2100 in a nineteenth embodiment of the present invention. The integrated circuit package system 2100 preferably includes the integrated circuit package system 600 and module connectors 2102 such as solder or other conductive material.

The module connectors 2102 attached over the module lead array 602 can be substantially exposed for electrical connectivity for other devices or components such as another package, electrical connectors, or a next level system.

Similarly, the module substrate conductors 616 can be substantially exposed near a side of the module substrate 606 for electrical connectivity for other devices or components such as another package, electrical connectors, or a next level system.

Figure 22:
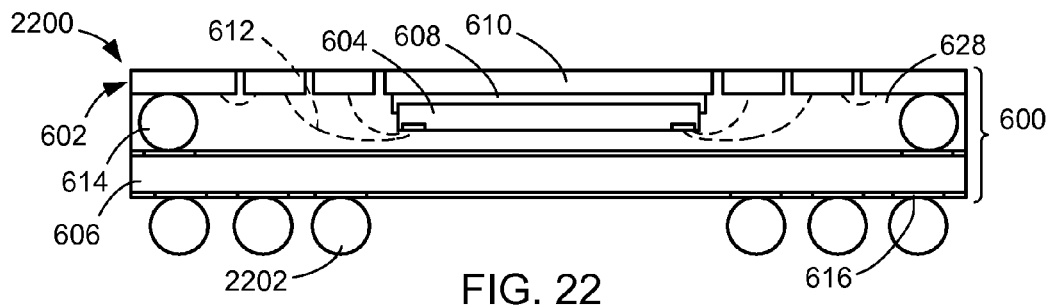
FIG. 22 is a cross-sectional view of an integrated circuit package system in a twentieth embodiment of the present invention.

Referring now to FIG. 22, therein is shown a cross-sectional view of an integrated circuit package system 2200 in a twentieth embodiment of the present invention. The integrated circuit package system 2200 preferably includes the integrated circuit package system 600 and module connectors 2202 such as solder or other conductive material.

The integrated circuit package system 600 is shown in an inverted configuration for attaching or mounting the module substrate 606 over another component as well as providing an attaching or mounting surface over the module lead array 602.

The module connectors 2202 attached over the module substrate conductors 616 of the module substrate 606 can be substantially exposed for electrical connectivity for other devices or components such as another package, electrical connectors, or a next level system.

Similarly, an external surface of the module lead array 602 can be substantially exposed for electrical connectivity for other devices or components such as another package, electrical connectors, or a next level system.

Figure 23:
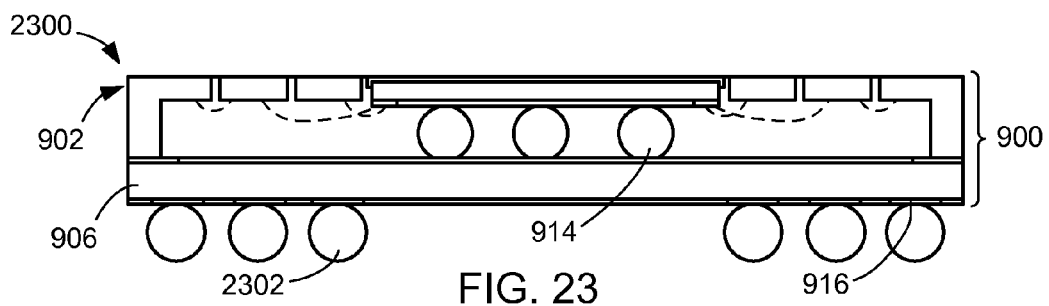
FIG. 23 is a cross-sectional view of an integrated circuit package system in a twenty-first embodiment of the present invention.

Referring now to FIG. 23, therein is shown a cross-sectional view of an integrated circuit package system 2300 in a twenty-first embodiment of the present invention. The integrated circuit package system 2300 preferably includes the integrated circuit package system 900 and module connectors 2302 such as solder or other conductive material.

The integrated circuit package system 900 is shown in an inverted configuration for attaching or mounting the module substrate 906 over another component as well as providing an attaching or mounting surface over the module lead array 902.

The module connectors 2302 attached over the module substrate conductors 916 of the module substrate 906 can be substantially exposed for electrical connectivity for other devices or components such as another package, electrical connectors, or a next level system.

Similarly, an external surface of the module lead array 902 can be substantially exposed for electrical connectivity for other devices or components such as another package, electrical connectors, or a next level system.

Figure 24:
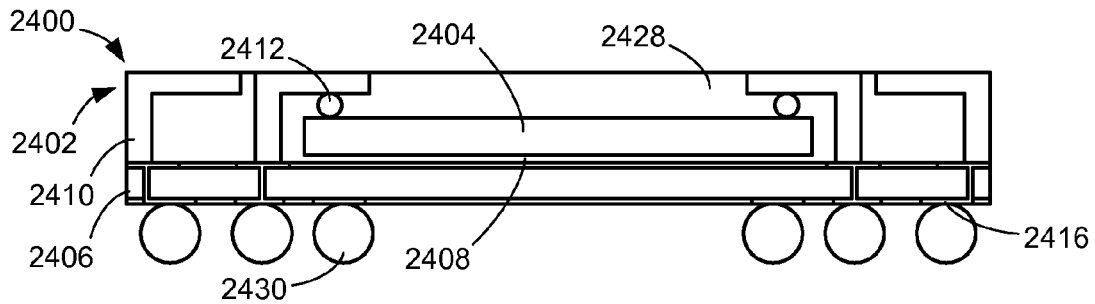
FIG. 24 is a cross-sectional view of an integrated circuit package system in a twenty-second embodiment of the present invention.

Referring now to FIG. 24, therein is shown a cross-sectional view of an integrated circuit package system 2400 in a twenty-second embodiment of the present invention. The integrated circuit package system 2400 preferably includes a module lead array 2402, a module integrated circuit 2404 connected thereto, and a module substrate 2406 over the module integrated circuit 2404.

The module integrated circuit 2404 can be attached or mounted with a module die attach layer 2408 applied over a die attach region of the module lead array 2402. The module lead array 2402 can also include post type leads 2410 connecting the module substrate 2406 to the module lead array 2402. Module die connectors 2412 can electrically connect the module integrated circuit 2404 to the module lead array 2402.

The module substrate 2406 can include module substrate conductors 2416. The module substrate conductors 2416 can provide electrical connections through the module substrate 2406 as well as over surfaces of the module substrate 2406. The module substrate conductors 2416 can provide electrical connectivity to the post type leads 2410 or for other devices or components such as another package, electrical connectors, or a next level system.

A module encapsulant 2428 can cover or protect the module integrated circuit 2404, the module die connectors 2412, the post type leads 2410, or the module die connectors 2412. The module encapsulant 2428 can provide substantially fixed positions for the module die connectors 2412 or the post type leads 2410 for electrical isolation. The post type leads 2410 can also be partially exposed providing a mounting or connection region for the module substrate 2406.

The module substrate 2406 can be attached or mounted over the module encapsulant 2428 and electrically connected to the post type leads 2410 providing electrical connectivity through the module substrate 2406 and the post type leads 2410 to package connectors 2430. The package connectors 2430 provide electrical connectivity to a next level system such as a printed circuit board or a product subsystem.

Figure 25:
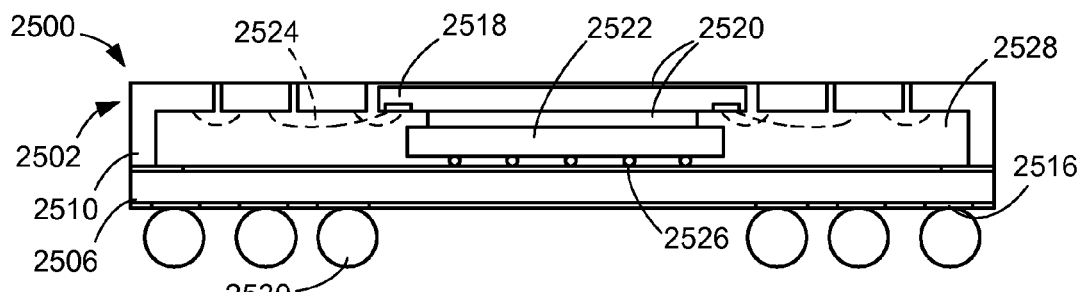
FIG. 25 is a cross-sectional view of an integrated circuit package system in a twenty-third embodiment of the present invention.

Referring now to FIG. 25, therein is shown a cross-sectional view of an integrated circuit package system 2500 in a twenty-third embodiment of the present invention. The integrated circuit package system 2500 preferably includes a module lead array 2502, and a module substrate 2506.

The module lead array 2502 can also include post type leads 2510 connecting the module substrate 2506 to the module lead array 2502. The module substrate 2506 can include module substrate conductors 2516. The module substrate conductors 2516 can provide electrical connections through the module substrate 2506 as well as over surfaces of the module substrate 2506.

A module integrated circuit 2518 can be attached or mounted with a die attach material 2520 applied over a die attach region such as a tape, fixture, or pad (not shown). A module stack die 2522 can be mounted over the module integrated circuit 2518 with the die attach material 2520.

First die connectors 2524 such as wires, planar interconnect, conductors, or combination thereof can electrically connect the module integrated circuit 2518 and the module lead array 2502. Second die connectors 2526 such solder bumps, conductors, or combination thereof can electrically connect the module stack die 2522 and the module substrate 2506.

A module encapsulant 2528 can cover and protect the module integrated circuit 2518, the module stack die 2522, the first die connectors 2524, the second die connectors 2526, or the post type leads 2510. The module encapsulant 2528 can provide substantially fixed positions for the first die connectors 2524, the second die connectors 2526, or the post type leads 2510 for electrical isolation.

The post type leads 2510 can be partially exposed providing a mounting or connection region for the module substrate 2506. Similarly, a side of the module lead array 2502 opposite the module substrate 2506 can also be substantially exposed providing a mounting or connection region for other devices or components such as another package, electrical connectors, or a next level system.

The module substrate 2506 can be attached or mounted over the module encapsulant 2528 and electrically connected to the post type leads 2510 providing electrical connectivity through the module substrate 2506 and the post type leads 2510 to package connectors 2530.

Figure 26:
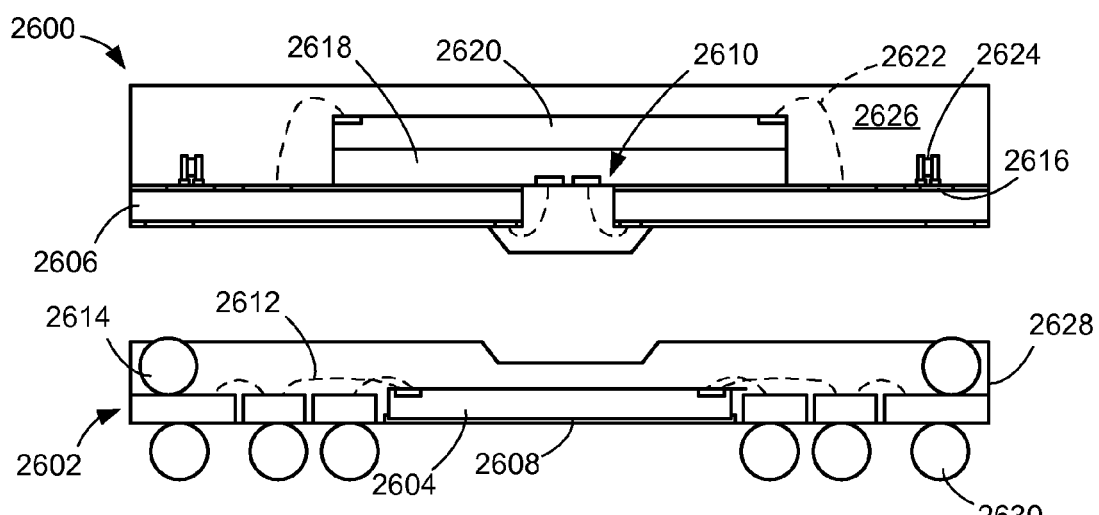
FIG. 26 is a cross-sectional view of an integrated circuit package system in a twenty-fourth embodiment of the present invention.

Referring now to FIG. 26, therein is shown a cross-sectional view of an integrated circuit package system 2600 in a twenty-fourth embodiment of the present invention. The integrated circuit package system 2600 preferably includes a module lead array 2602, a module integrated circuit 2604 connected thereto, and a module substrate 2606 over the module integrated circuit 2604.

The module integrated circuit 2604 can be attached or mounted with a module die attach layer 2608 applied over a die attach region such as a tape, fixture, or pad (not shown). Module die connectors 2612 can electrically connect the module integrated circuit 2604 or the module lead array 2602.

Embedded connectors 2614 can electrically connect the module substrate 2606 to the module lead array 2602. The module die connectors 2612 and the embedded connectors 2614 can provide connectivity for the module integrated circuit 2604 with the module lead array 2602 or thereby the module substrate 2606.

The module substrate 2606 can include a module substrate opening 2610 and module substrate conductors 2616. The module substrate conductors 2616 can provide electrical connections through the module substrate 2606 as well as over surfaces of the module substrate 2606.

A first stack die 2618 can be mounted over the module substrate opening 2610. A second stack die 2620 can be mounted over the first stack die 2618. Module stack connectors 2622 such as wires, planar interconnect, any conductor, or combination thereof can electrically connect the first stack die 2618 and the second stack die 2620 to the module substrate 2606.

The module stack connectors 2622 can connect the first stack die 2618 through the module substrate opening 2610 to a side of the module substrate 2606 opposite the first stack die 2618. The second stack die 2620 can be connected to the module substrate 2606 adjacent the first stack die 2618.

A first module encapsulant 2626 can cover and protect the first stack die 2618, the second stack die 2620, the module stack connectors 2622, and a component 2624 such as a passive device or other device. The component 2624 can be attached or mounted over the module substrate 2606 adjacent the first stack die 2618.

A second module encapsulant 2628 can cover or protect the module integrated circuit 2604, the module die connectors 2612, and the embedded connectors 2614. The embedded connectors 2614 can also be partially exposed providing a mounting or connection region for the module substrate 2606.

The module substrate 2606 can be attached or mounted over the second module encapsulant 2628 and electrically connected to the embedded connectors 2614, the module lead array 2602, and package connectors 2630. The package connectors 2630 can provide electrical connectivity to a next level system such as a printed circuit board or a product subsystem.

Figure 27:
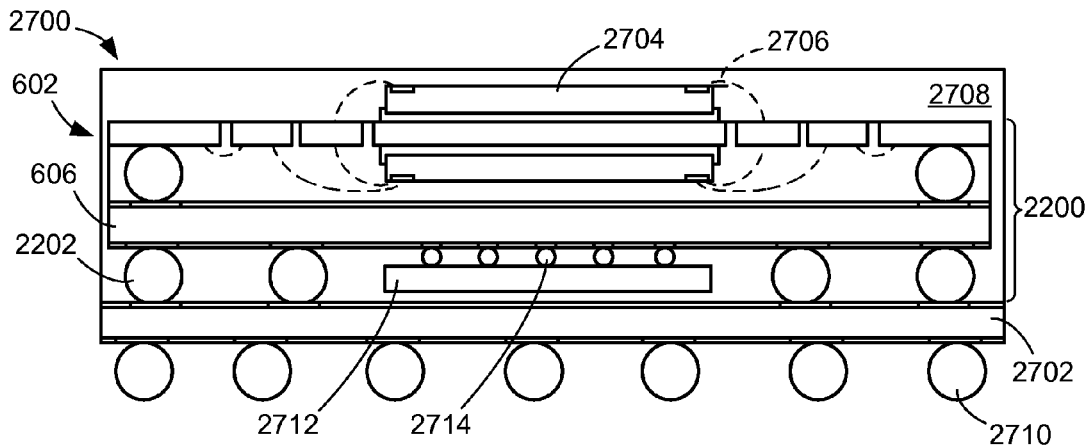
FIG. 27 is a cross-sectional view of an integrated circuit package system in a twenty-fifth embodiment of the present invention.

Referring now to FIG. 27, therein is shown a cross-sectional view of an integrated circuit package system 2700 in a twenty-fifth embodiment of the present invention. The integrated circuit package system 2700 preferably includes the integrated circuit package system 2200, a package substrate 2702, and a stack component 2704.

The integrated circuit package system 2200 can be attached or mounted over the package substrate 2702. The module connectors 2202 can electrically connect the module substrate 606 and the package substrate 2702 thereby providing connectivity for the integrated circuit package system 2200 to other devices, other components, or a next level system.

The stack component 2704 such as an integrated circuit die, an electronic component, or another package can be mounted over the module lead array 602. Stack component connectors 2706 can electrically connect the stack component 2704 and the module lead array 602.

A package encapsulant 2708 can cover or protect the stack component 2704, the stack component connectors 2706, the integrated circuit package system 2200, and a portion of the package substrate 2702. The package encapsulant 2708 can be conformal providing sealing or structural integrity to components and devices.

Package connectors 2710 such as solder or other conductive material can be attached or formed over the package substrate 2702 on a side opposite the module connectors 2202. The package connectors 2710 can provide electrical connectivity to a next level system such as a printed circuit board or a product subsystem.

A second stack component 2712 can be mounted over the module substrate 606 adjacent the module connectors 2202. The second stack component 2712 can be attached with second stack component connectors 2714 such as solder or other conductor. For example, the second stack component 2712 can be a flip chip having the second stack component connectors 2714 formed thereon as solder bumps.

Figure 28:
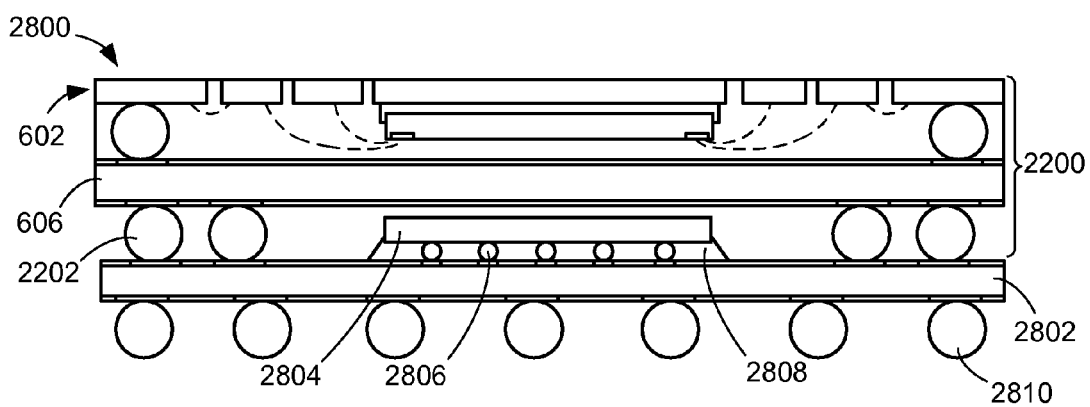
FIG. 28 is a cross-sectional view of an integrated circuit package system in a twenty-sixth embodiment of the present invention.

Referring now to FIG. 28, therein is shown a cross-sectional view of an integrated circuit package system 2800 in a twenty-sixth embodiment of the present invention. The integrated circuit package system 2800 preferably includes the integrated circuit package system 2200, a package substrate 2802, and a stack component 2804.

The integrated circuit package system 2200 can be attached or mounted over the package substrate 2802. The module connectors 2202 can electrically connect the module substrate 606 and the package substrate 2802 thereby providing connectivity for the integrated circuit package system 2200 to other devices, other components, or a next level system.

The stack component 2804 such as an integrated circuit die, an electronic component, or another package can be mounted over the package substrate 2802. Stack component connectors 2806 can electrically connect the stack component 2804 and the package substrate 2802.

A fill material 2808 can be formed adjacent the stack component connectors 2806. The fill material can conform to the stack component connectors 2806, a side of the stack component 2804, or the package substrate 2802 and include any non-conductive material having adhesive or non-adhesive properties.

Package connectors 2810 such as solder or other conductive material can be attached or formed over the package substrate 2802 on as side opposite the stack component 2804. The package connectors 2810 can provide electrical connectivity to a next level system such as a printed circuit board or a product subsystem.

Figure 29:
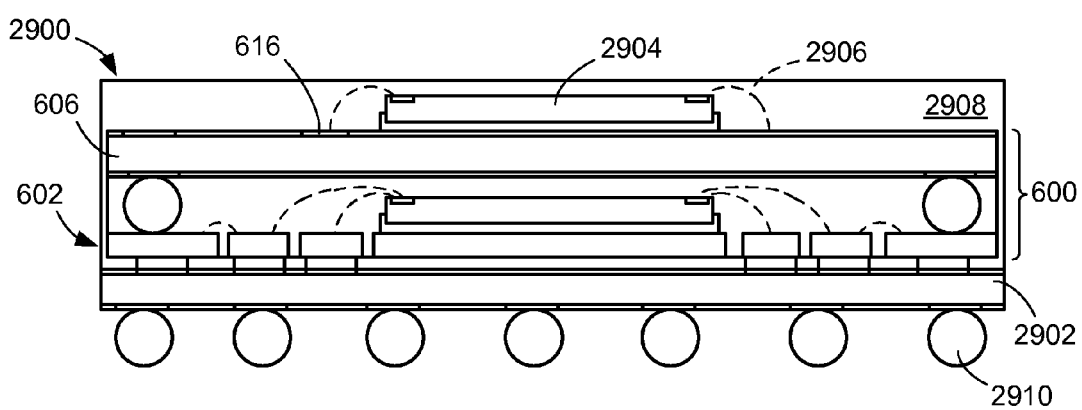
FIG. 29 is a cross-sectional view of an integrated circuit package system in a twenty-seventh embodiment of the present invention.

Referring now to FIG. 29, therein is shown a cross-sectional view of an integrated circuit package system 2900 in a twenty-seventh embodiment of the present invention. The integrated circuit package system 2900 preferably includes the integrated circuit package system 600, a package substrate 2902, and a stack component 2904.

The integrated circuit package system 600 can be attached or mounted over the package substrate 2902. The module lead array 602 can electrically connect to the package substrate 2902 thereby providing connectivity for the integrated circuit package system 600 to other devices, other components, or a next level system.

The stack component 2904 such as an integrated circuit die, an electronic component, or another package can be mounted over the module substrate 606. Stack component connectors 2906 can electrically connect the stack component 2904 and the module substrate conductors 616 of the module substrate 606.

A package encapsulant 2908 can cover or protect the stack component 2904, the stack component connectors 2906, the integrated circuit package system 600, and a portion of the package substrate 2902. The package encapsulant 2908 can be conformal providing sealing or structural integrity to components and devices.

Package connectors 2910 such as solder or other conductive material can be attached or formed over the package substrate 2902 on as side opposite the stack component 2904. The package connectors 2910 can provide electrical connectivity to a next level system such as a printed circuit board or a product subsystem.

Figure 30:
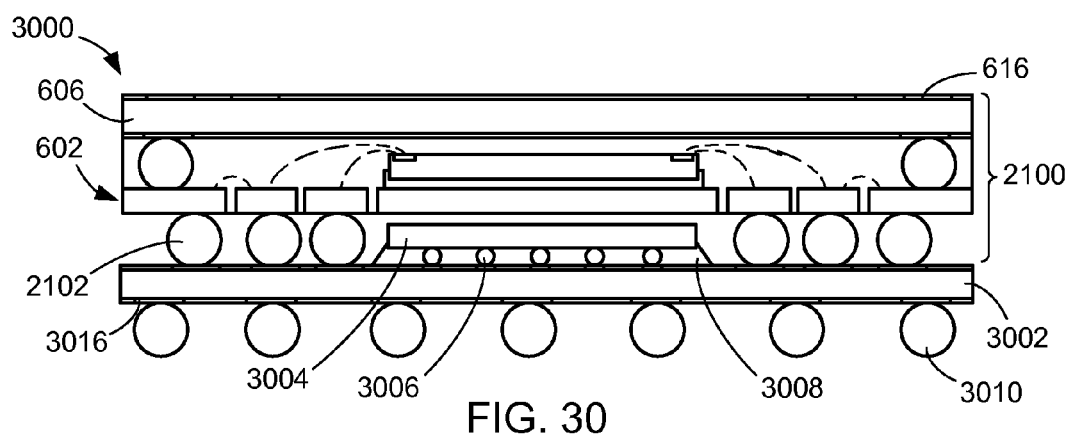
FIG. 30 is a cross-sectional view of an integrated circuit package system in a twenty-eighth embodiment of the present invention.

Referring now to FIG. 30, therein is shown a cross-sectional view of an integrated circuit package system 3000 in a twenty-eighth embodiment of the present invention. The integrated circuit package system 3000 preferably includes the integrated circuit package system 2100, a package substrate 3002, and a stack component 3004.

The integrated circuit package system 2100 can be attached or mounted over the package substrate 3002. The module connectors 2102 can electrically connect the module lead array 602 and the package substrate 3002 thereby providing connectivity for the integrated circuit package system 2100 to other devices, other components, or a next level system.

The stack component 3004 such as an integrated circuit die, an electronic component, or another package can be mounted over the package substrate 3002. Stack component connectors 3006 can electrically connect the stack component 3004 and the package substrate 3002.

A fill material 3008 can be formed adjacent the stack component connectors 3006. The fill material can conform to the stack component connectors 3006, a side of the stack component 3004, or the package substrate 3002 and include any non-conductive material having adhesive or non-adhesive properties.

Package connectors 3010 such as solder or other conductive material can be attached or formed over the package substrate 3002 on as side opposite the stack component 3004. The package connectors 3010 can provide electrical connectivity to a next level system such as a printed circuit board or a product subsystem.

Figure 31:
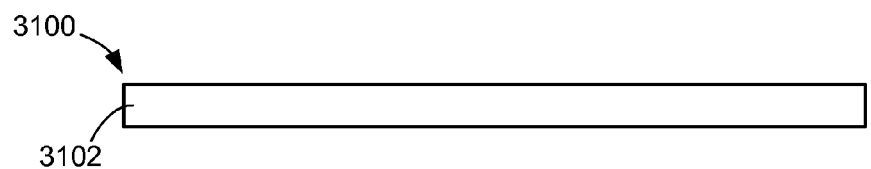
FIG. 31 is a cross-sectional view of an integrated circuit package system in a base phase of a twenty-ninth embodiment of the present invention.

Referring now to FIG. 31, therein is shown a cross-sectional view of an integrated circuit package system 3100 in a base phase of a twenty-ninth embodiment of the present invention. The integrated circuit package system 3100 preferably includes a leadframe 3102. The leadframe 3102 can be formed of a conductive material such as copper (Cu) or an alloy thereof.

A formation process such as deposition, etch, stamp, or other modification process can be applied to the leadframe 3102. For illustrative purposes, the leadframe 3102 is shown having a rectangular shape although it is understood that the leadframe 3102 may be of any shape or dimensions.

Figure 32:
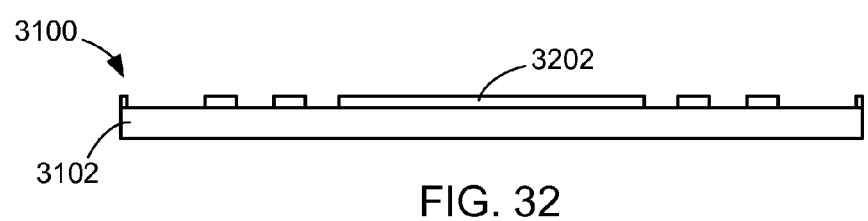
FIG. 32 is the structure of FIG. 31 in a mask phase.

Referring now to FIG. 32, therein is shown the structure of FIG. 31 in a mask phase. The integrated circuit package system 3100 preferably includes the leadframe 3102 and a mask 3202 such as a photomask including photoresist.

The mask 3202 can be applied over the leadframe 3102 covering regions to be blocked or resisted from further processing such as exposure, deposition, etch, or other modification process. For illustrative purposes, the mask 3202 is shown having a symmetrical pattern although it is understood that the mask 3202 may be of any shape, pattern, or dimension.

Figure 33:
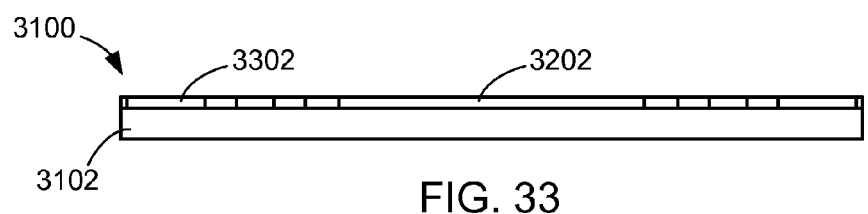
FIG. 33 is the structure of FIG. 32 in a deposition phase.

Referring now to FIG. 33, therein is shown the structure of FIG. 32 in a deposition phase. The integrated circuit package system 3100 preferably includes a plate 3302 adjacent the mask 3202 over the leadframe 3102. The plate 3302 can be a conductive material including alloys.

The plate 3302 can be formed in regions of the leadframe 3102 without the mask 3202. A plating process such as deposition, sputtering, electroplating or other plating process provides a conductive layer over regions of the leadframe 3102 predetermined for conductor attachment.

Figure 34:
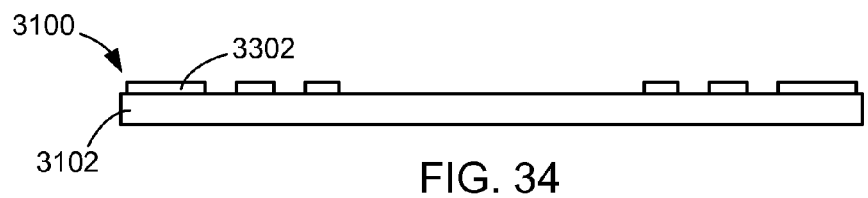
FIG. 34 is the structure of FIG. 33 in a removal phase.

Referring now to FIG. 34, therein is shown the structure of FIG. 33 in a removal phase. The integrated circuit package system 3100 preferably includes the leadframe 3102 and the plate 3302 without the mask 3202 of FIG. 33.

The plate 3302 provides a conductive surface for conductor attachment particularly with conductors having limited adhesion to the leadframe 3102. The plate 3302 can provide significantly improved contact, adhesion, or reliability for conductor attachment.

Figure 35:
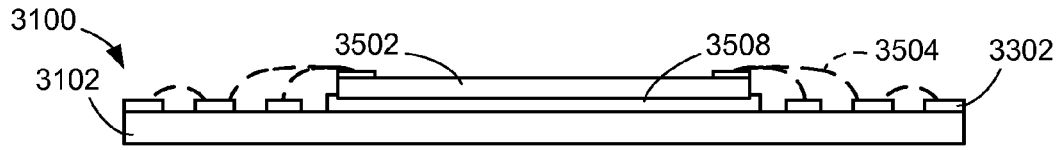
FIG. 35 is an integrated circuit package system in an attach phase of a thirtieth embodiment of the present invention.

Referring now to FIG. 35, therein is shown an integrated circuit package system 3100 in an attach phase of a thirtieth embodiment of the present invention. The structure of FIG. 34 is shown with a module integrated circuit 3502, and module die connectors 3504.

The module integrated circuit 3502 can be mounted over the leadframe 3102 with an attach material 3508. The module die connectors 3504 can electrically connect the module integrated circuit 3502 and the plate 3302 of the leadframe 3102.

Figure 36:
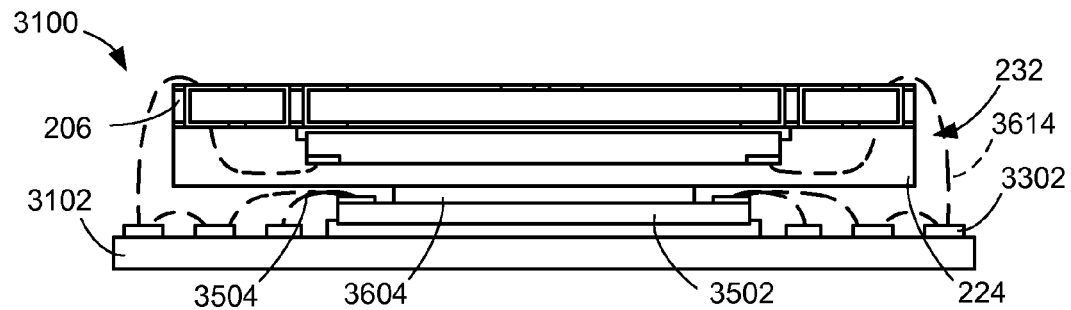
FIG. 36 is the structure of FIG. 35 in a stack phase.

Referring now to FIG. 36, therein is shown the structure of FIG. 35 in a stack phase. The integrated circuit package system 3100 preferably includes the leadframe 3102 having the plate 3302, the module integrated circuit 3502, and the module stack component 232 such as a package or other device.

The module stack component 232 can be attached over the module integrated circuit 3502 with a spacer 3604. The spacer 3604 can be of any material and provide a spacing predetermined for the module die connectors 3504 or other components. Spacing can prevent damage or distortion resulting in failures caused as shorts, opens, or reliability.

The module stack encapsulant 224 can be mounted to the spacer 3604 having the module substrate 206 on side opposite the leadframe 3102. Module substrate connectors 3614 can electrically connect the module substrate 206 to the leadframe 3102.

Figure 37:
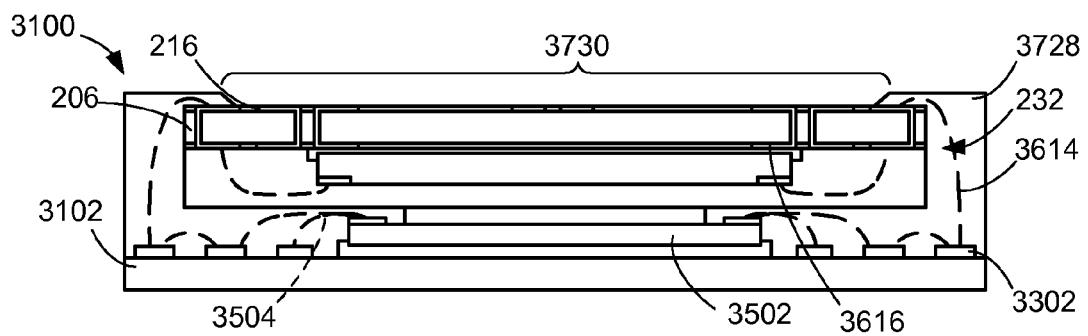
FIG. 37 is the structure of FIG. 36 in a mold phase.

Referring now to FIG. 37, therein is shown the structure of FIG. 36 in a mold phase. The integrated circuit package system 3100 preferably includes the leadframe 3102 having the plate 3302, the module integrated circuit 3502, the module stack component 232, and a module encapsulant 3728.

The module encapsulant 3728 can cover or protect the module integrated circuit 3502, the module die connectors 3504, and the module substrate connectors 3614. The module encapsulant 3728 can provide substantially fixed positions for the module die connectors 3504 and the module substrate connectors 3614 resulting in electrical isolation of individual signals or electrical levels transmitted by the module die connectors 3504 or the module substrate connectors 3614.

The module encapsulant 3728 can include a module encapsulant cavity 3730. The module encapsulant cavity 3730 can be formed over the module substrate 206 providing a side opposite the module integrated circuit 3502 partially exposed. A portion of the module substrate conductors 216 can be exposed in the module encapsulant cavity 3730 for electrical connectivity to or through the module substrate 206.

Figure 38:
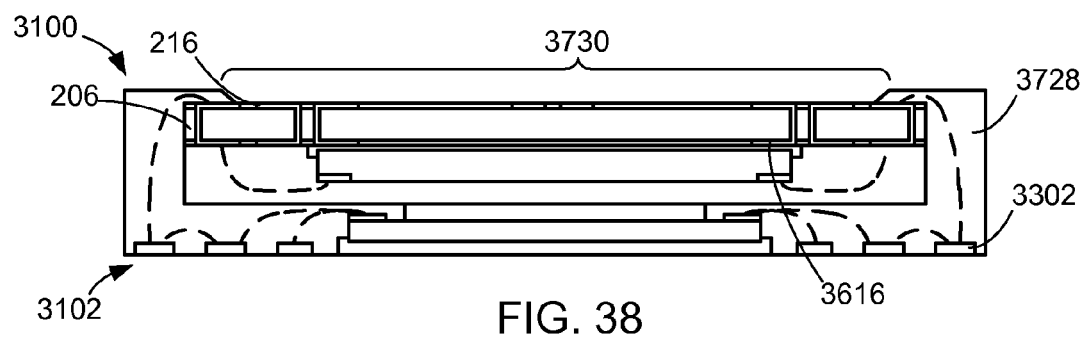
FIG. 38 is the structure of FIG. 37 in a dissolve phase.

Referring now to FIG. 38, therein is shown the structure of FIG. 37 in a dissolve phase. The integrated circuit package system 3100 preferably includes the leadframe 3102, the module substrate 206, and the module encapsulant 3728.

A process such as a dissolving process can be applied to the leadframe 3102 substantially exposing portions of the leadframe 3102 near regions having the plate 3302. Exposed portions of the leadframe 3102 can form leads in an array such as a module lead array.

The integrated circuit package system 3100 also provides the module substrate conductors 216 substantially exposed through the module encapsulant cavity 3730. Exposed portions of the module substrate conductors 216 and the leadframe 3102 can provide connectivity to other devices, other components, or a next level system.

Figure 39:
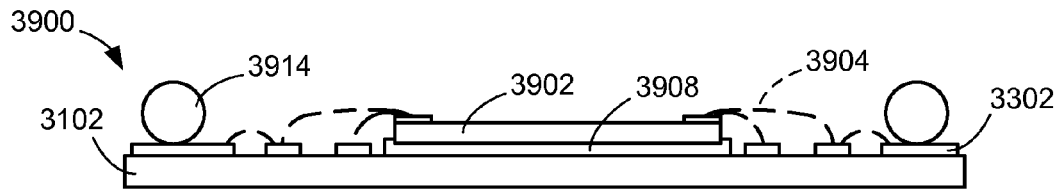
FIG. 39 is an integrated package system in an attach phase of a thirty-first embodiment of the present invention.

Referring now to FIG. 39, therein is shown an integrated circuit package system 3900 in an attach phase of a thirty-first embodiment of the present invention. The structure of FIG. 34 is shown with a module integrated circuit 3902, module die connectors 3904, and embedded connectors 3914.

The module integrated circuit 3902 can be mounted over the leadframe 3102 with an attach material 3908. The module die connectors 3904 can electrically connect the module integrated circuit 3902 and the plate 3302 of the leadframe 3102.

The embedded connectors 3914 can be formed, attached, or mounted over the plate 3302 and adjacent the module die connectors 3904 or the module integrated circuit 3902. The embedded connectors 3914 can provide electrical connectivity to the leadframe 3102 and other components.

Figure 40:
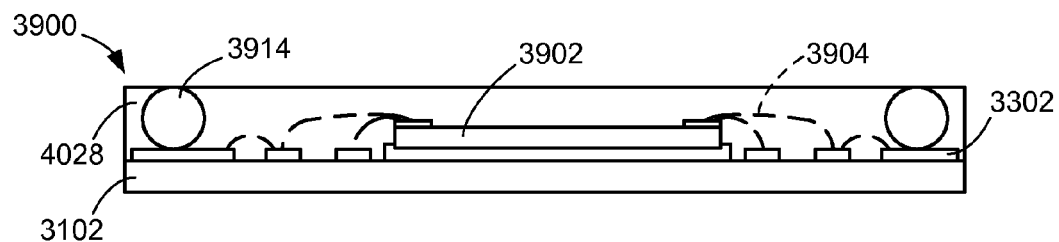
FIG. 40 is the structure of FIG. 39 in a mold phase.

Referring now to FIG. 40, therein is shown the structure of FIG. 39 in a mold phase. The integrated circuit package system 3900 preferably includes the leadframe 3102 having the plate 3302, the module integrated circuit 3902, the module die connectors 3904, the embedded connectors 3914, and a module encapsulant 4028.

The module encapsulant 4028 can cover or protect the module integrated circuit 3902, the module die connectors 3904, and the embedded connectors 3914. The module encapsulant 4028 can provide substantially fixed positions for the module die connectors 3904 and the embedded connectors 3914 resulting in electrical isolation of individual signals or electrical levels transmitted by the module die connectors 3904 or the embedded connectors 3914.

The embedded connectors 3914 can also be partially exposed providing a mounting or connection region on a side opposite the leadframe 3102 for attaching or mounting a device or component.

Figure 41:
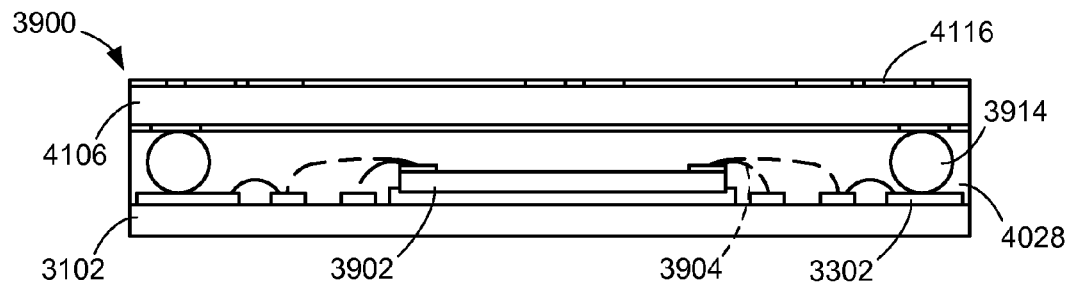
FIG. 41 is the structure of FIG. 40 in a stack phase.

Referring now to FIG. 41, therein is shown the structure of FIG. 40 in a stack phase. The integrated circuit package system 3900 preferably includes the module encapsulant 4028 over the module integrated circuit 3502, the module die connectors 3904, the embedded connectors 3914, and the leadframe 3102.

A module substrate 4106 can be attached or mounted over the module encapsulant 4028 and connected to the embedded connectors 3914. Module substrate conductors 4116 can provide electrical connectivity to the embedded connectors 3914 as well as through the module substrate 4106.

Figure 42:
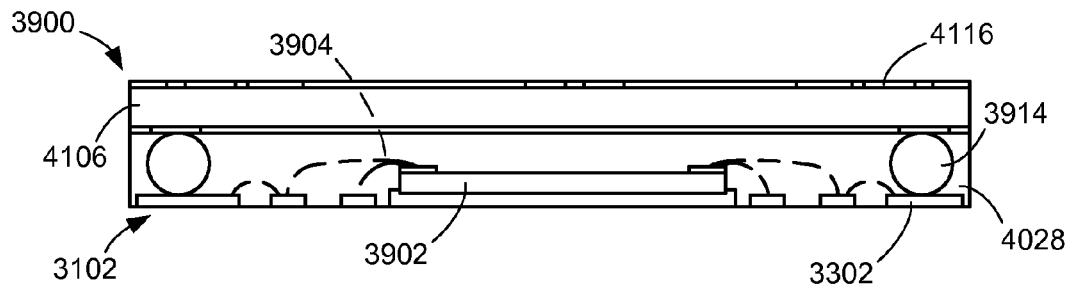
FIG. 42 is the structure of FIG. 41 in a dissolve phase.

Referring now to FIG. 42, therein is shown the structure of FIG. 41 in a dissolve phase. The integrated circuit package system 3900 preferably includes the leadframe 3102, the module substrate 4106, and the module encapsulant 4028.

A process such as a dissolving process can be applied to the leadframe 3102 substantially exposing portions of the leadframe 3102 near regions having the plate 3302. Exposed portions of the leadframe 3102 can form leads in an array such as a module lead array.

The integrated circuit package system 3900 also provides the module substrate conductors 4116 substantially exposed. Exposed portions of the module substrate conductors 4116 and the leadframe 3102 can provide connectivity to other devices, other components, or a next level system.

Figure 43:
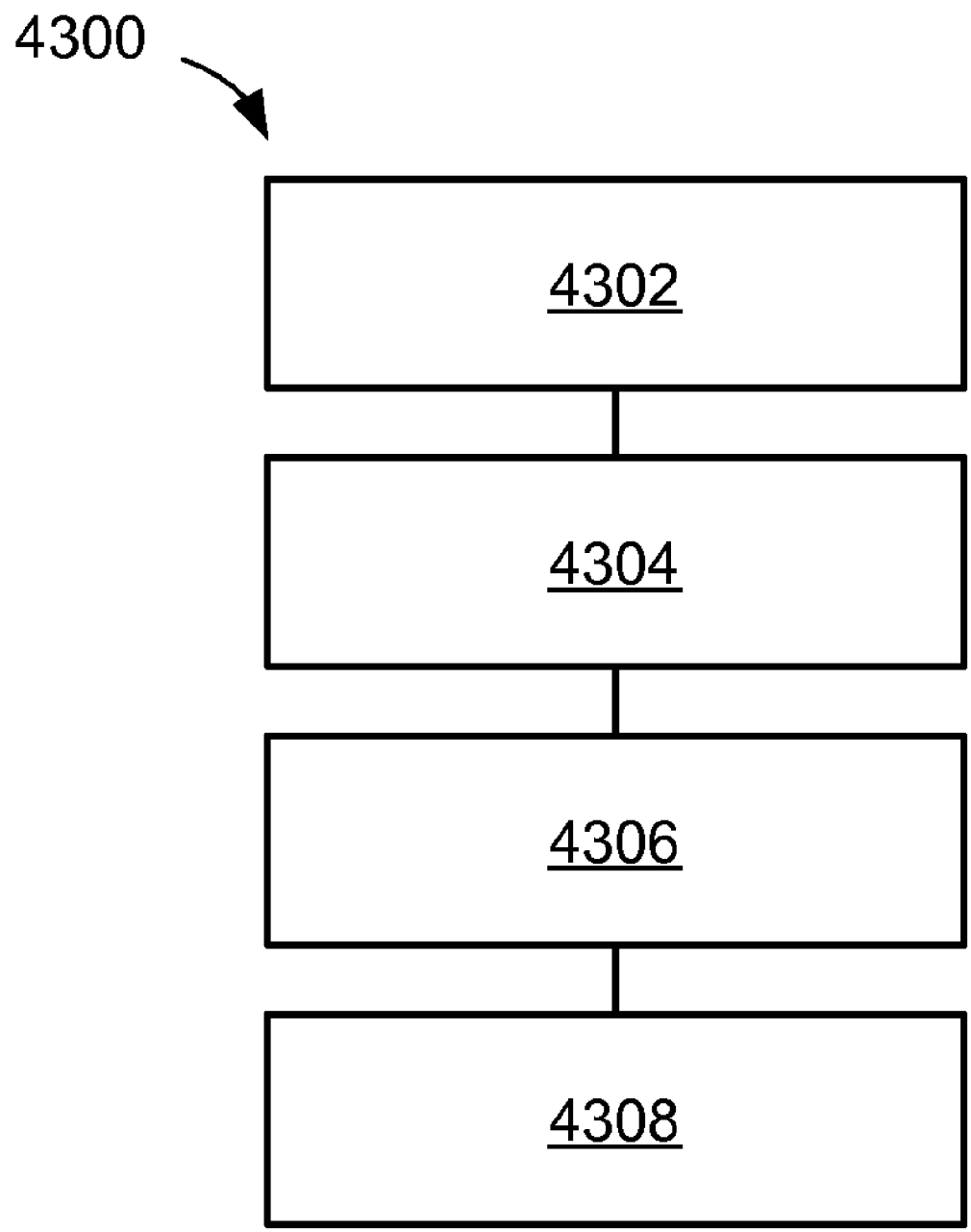
FIG. 43 is a flow chart of an integrated circuit package system for manufacturing the integrated circuit package system in an embodiment of the present invention.

Referring now to FIG. 43, therein is shown a flow chart of an integrated circuit package system 4300 for manufacturing the integrated circuit package system 100 in an embodiment of the present invention. The system 4300 includes providing a module lead array in a block 4302; attaching a module integrated circuit adjacent the module lead array in a block 4304; attaching a module substrate over the module integrated circuit in a block 4306; and applying an encapsulant over the module integrated circuit wherein the module lead array and the module substrate are partially exposed in a block 4308

In greater detail, a system to provide the method and apparatus of the integrated circuit package system 100, in an embodiment of the present invention, is performed as follows:

1. Forming a module lead array having a die attach region.
2. Mounting a module integrated circuit over the die attach region adjacent the module lead array.
3. Connecting die connectors to the module integrated circuit and the module lead array.
4. Mounting a module substrate having module substrate conductors over the module integrated circuit on a side opposite the module lead array.
5. Connecting module substrate connectors to the module substrate and the module lead array.
6. Forming an encapsulant over the module integrated circuit, the module die connectors, and the module substrate connectors wherein the module lead array and the module substrate conductors are partially exposed.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
providing a module lead array;
attaching a module integrated circuit adjacent the module lead array;
attaching a module substrate over the module integrated circuit; and
applying a module encapsulant over the module integrated circuit wherein the module lead array and the module substrate are partially exposed.

2. The system as claimed in claim 1 wherein attaching the module substrate includes attaching the module substrate having a module stack die thereover.

3. The system as claimed in claim 1 wherein attaching the module integrated circuit includes attaching a spacer over the module integrated circuit.

4. The system as claimed in claim 1 wherein attaching the module substrate includes attaching the module substrate over an embedded connector.

5. The system as claimed in claim 1 wherein providing the module lead array includes forming the module lead array with a post type lead.

6. An integrated circuit package system comprising:
forming a module lead array having a die attach region;
mounting a module integrated circuit over the die attach region adjacent the module lead array;
connecting module die connectors to the module integrated circuit and the module lead array;
mounting a module substrate having module substrate conductors over the module integrated circuit on a side opposite the module lead array;
connecting module substrate connectors to the module substrate and the module lead array; and forming a module encapsulant over the module integrated circuit wherein the module lead array and the module substrate conductors are partially exposed.

7. The system as claimed in claim 6 further comprising mounting a stack component over the module substrate.

8. The system as claimed in claim 6 further comprising mounting a stack component over the module lead array.

9. The system as claimed in claim 6 further comprising providing a package substrate having the module integrated circuit, the module lead array, and the module substrate thereover.

10. The system as claimed in claim 6 wherein forming the module encapsulant includes forming a module encapsulant cavity over the module substrate.

11. An integrated circuit package system comprising:
   a module lead array;
   a module integrated circuit adjacent the module lead array;
   a module substrate over the module integrated circuit; and
   a module encapsulant over the module integrated circuit wherein the module lead array and the module substrate are partially exposed.

12. The system as claimed in claim 11 wherein the module substrate includes the module substrate having a module stack die thereover.

13. The system as claimed in claim 11 wherein the module integrated circuit includes a spacer over the module integrated circuit.

14. The system as claimed in claim 11 wherein the module substrate includes the module substrate over an embedded connector.

15. The system as claimed in claim 11 wherein the module lead array includes a post type lead.

16. The system as claimed in claim 11 further comprising:
   the module lead array has a die attach region;
   the module integrated circuit is over the die attach region adjacent the module lead array;
   the module substrate is the module substrate having module substrate conductors over the module integrated circuit on a side opposite the module lead array;
   the module encapsulant is over the module integrated circuit wherein the module lead array and the module substrate conductors are partially exposed;
further comprising:
   module die connectors connected to the module integrated circuit and the module lead array; and
   module substrate connectors connected to the module substrate and the module lead array.

17. The system as claimed in claim 16 further comprising a stack component over the module substrate.

18. The system as claimed in claim 16 further comprising a stack component over the module lead array.

19. The system as claimed in claim 16 further comprising a package substrate having the module integrated circuit, the module lead array, and the module substrate thereover.

20. The system as claimed in claim 16 wherein the module encapsulant includes a module encapsulant cavity over the module substrate.

* * * * *